US012614366B2

(12) United States Patent
Maldonado et al.

(10) Patent No.: US 12,614,366 B2
(45) Date of Patent: Apr. 28, 2026

(54) AUTOMATIC POINT CLOUD BUILDING ENVELOPE SEGMENTATION (AUTO-CuBES) USING MACHINE LEARNING

(71) Applicant: UT-Battelle, LLC, Oak Ridge, TN (US)

(72) Inventors: Bryan P. Maldonado, Knoxville, TN (US); Nolan W. Hayes, Jefferson City, TN (US); Diana Hun, Lenoir City, TN (US)

(73) Assignee: UT-Battelle, LLC, Oak Ridge, TN (US)

( * ) Notice: Subject to any disclaimer, the term of this patent is extended or adjusted under 35 U.S.C. 154(b) by 144 days.

(21) Appl. No.: 18/796,576

(22) Filed: Aug. 7, 2024

(65) Prior Publication Data

US 2025/0054267 A1     Feb. 13, 2025

Related U.S. Application Data

(60) Provisional application No. 63/531,406, filed on Aug. 8, 2023.

(51) Int. Cl.
*G06V 10/26* (2022.01)
*G06F 30/13* (2020.01)
(Continued)

(52) U.S. Cl.
CPC .............. *G06V 10/26* (2022.01); *G06F 30/13* (2020.01); *G06T 17/20* (2013.01); *G06V 10/507* (2022.01);
(Continued)

(58) Field of Classification Search
CPC ...... G06V 10/26; G06V 10/763; G06V 10/72; G06V 10/507; G06F 30/13; G06T 17/20;
(Continued)

(56) References Cited

U.S. PATENT DOCUMENTS

2021/0103726 A1* 4/2021 Lin ......................... G06F 30/13
2022/0366646 A1* 11/2022 Lopez Gavilan ....... G06T 17/00

OTHER PUBLICATIONS

Özdemir, E., and F. Remondino. "Segmentation of 3D photogrammetric point cloud for 3D building modeling." The International Archives of the Photogrammetry, Remote Sensing and Spatial Information Sciences 42 (2018): 135-142. (Year: 2018).*
Bayomi et al., "Building Enevlope Object Detection Using Yolo Models", ANNSIM, Jul. 2022, pp. 617-630.
Ozdemir et al., "Segmentation of 3D Photogrammetric Point Cloud for 3D Building Modeling", The International Archives of Photogrammetry, Remote Sensing and Spatial Information Sciences Oct. 2018, pp. 135-142.

(Continued)

*Primary Examiner* — Xin Sheng
(74) *Attorney, Agent, or Firm* — Warner Norcross + Judd LLP

(57) ABSTRACT
Modern retrofit construction practices use 3D point cloud data of the building envelope to obtain the as-built dimensions. However, manual segmentation by a trained professional is required to identify and measure window openings, door openings, and other architectural features, making the use of 3D point clouds labor-intensive. Automatic point Cloud Building Envelope Segmentation (Auto-CuBES) algorithms can significantly reduce the time spent during point cloud segmentation. The Auto-CuBES algorithm inputs a 3D point cloud generated by commonly available surveying equipment and outputs a dimensioned wire-frame model of the building envelope. By leveraging unsupervised machine learning methods in the Auto-CuBES methods facades, windows, and doors can be identified while keeping the number of calibration parameters low. Additionally, some embodiments of Auto-CuBES can generate a heat map of each facade indicating nonplanar characteristics that are valuable for optimization of connections used in overclad envelope retrofits.

20 Claims, 29 Drawing Sheets

(51) Int. Cl.
  *G06T 17/20*       (2006.01)
  *G06V 10/50*       (2022.01)
  *G06V 10/72*       (2022.01)
  *G06V 10/762*      (2022.01)

(52) U.S. Cl.
  CPC ............ *G06V 10/72* (2022.01); *G06V 10/763*
    (2022.01); *G06T 2200/24* (2013.01); *G06T*
    *2210/04* (2013.01); *G06T 2210/12* (2013.01);
    *G06T 2210/56* (2013.01)

(58) Field of Classification Search
  CPC ............. G06T 2200/24; G06T 2210/04; G06T
    2210/12; G06T 2210/56
  See application file for complete search history.

(56)            References Cited

OTHER PUBLICATIONS

Qi et al., "PointNet: Deep Learning on Point Sets for 3D Classification and Segmentation", CVF, 2017, pp. 652-660.
Arthur et al., "k-means++: The Advantages of Careful Seeding", Jul. 2007, pp. 1-9.
Ester et al., "A Density-Based Algorithm for Discovering Clusters", AAAI, 1996, pp. 226-231.

* cited by examiner

OPENING A

*900*

POINT CLOUD OF BUILDING ENVELOPE $P$ — *902*

IDENTIFY INDIVIDUAL FACADES $F$ — *904*

IDENTIFY FACADES FEATURES $W, I, and\ T$ — *906*

REMOVE OUTLIERS IN IDENTIFIED FEATURES — *908*

IDENTIFIED WALL $W_D$ AND INTERIOR $I_D$ POINTS? — *910*

NO

YES

WIRE-FRAME MODEL — *912*

CONNECTION WITH OPTIMIZED LENGTH

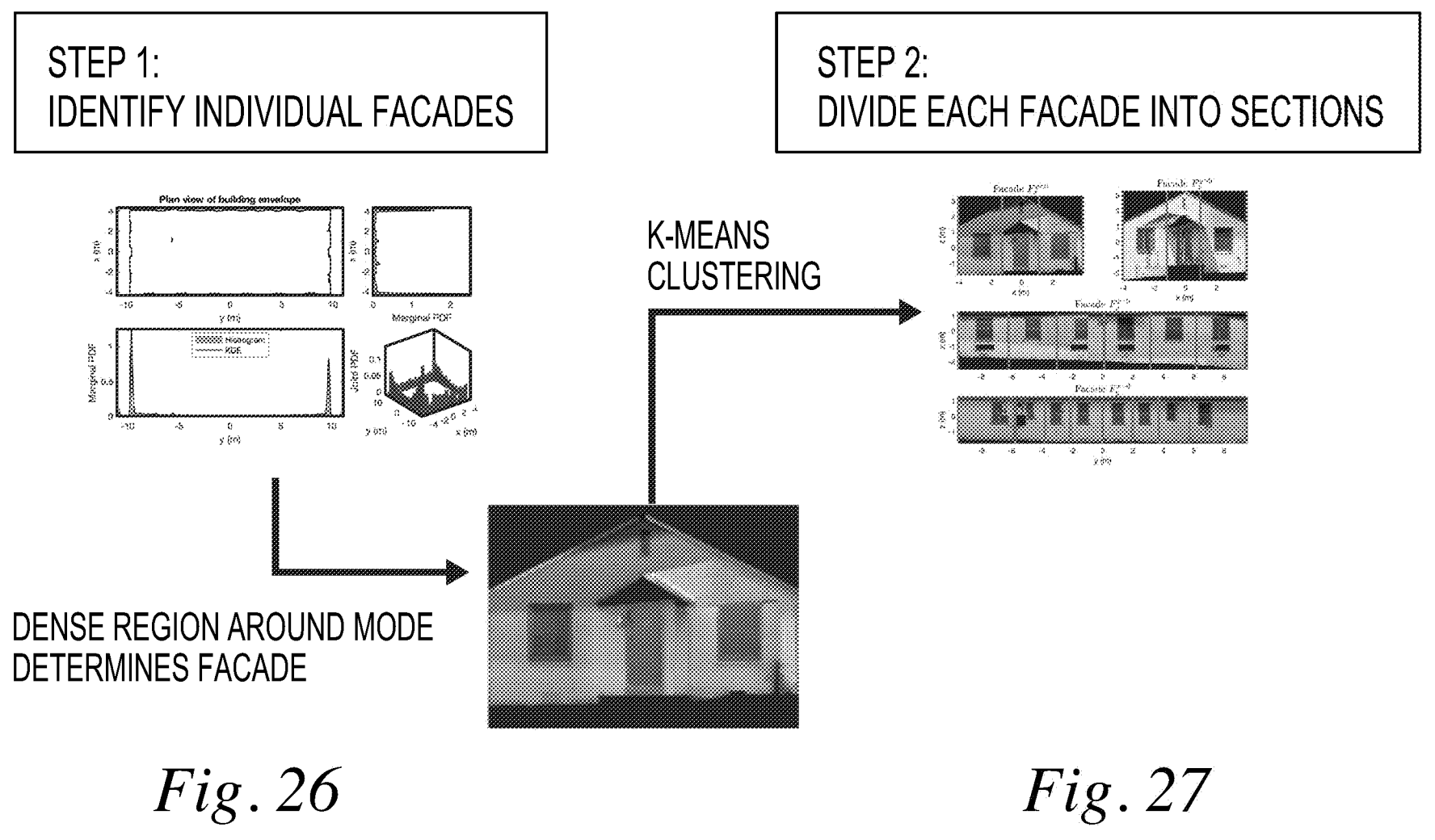

STEP 2:
DIVIDE EACH FACADE INTO SECTIONS

*Fig. 27*

K-MEANS
CLUSTERING

STEP 1:
IDENTIFY INDIVIDUAL FACADES

DENSE REGION AROUND MODE
DETERMINES FACADE

*Fig. 26*

Step 5:
Collect wall points and remove outliers
*Fig. 30*
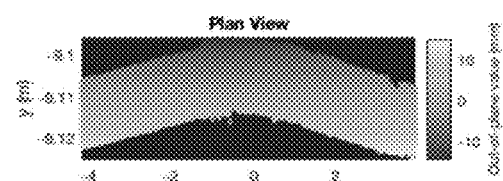
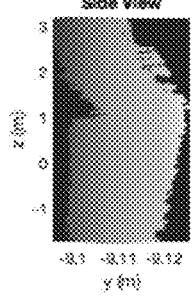
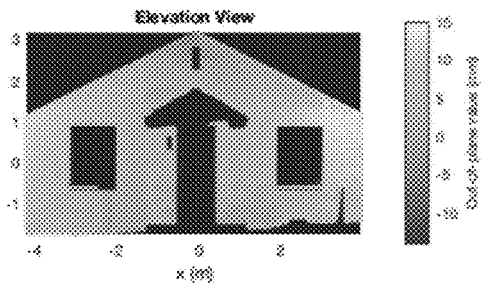
Step 6:
Compute convex hull and bounding box
Windows and
doors stored as
rectangular
prisms
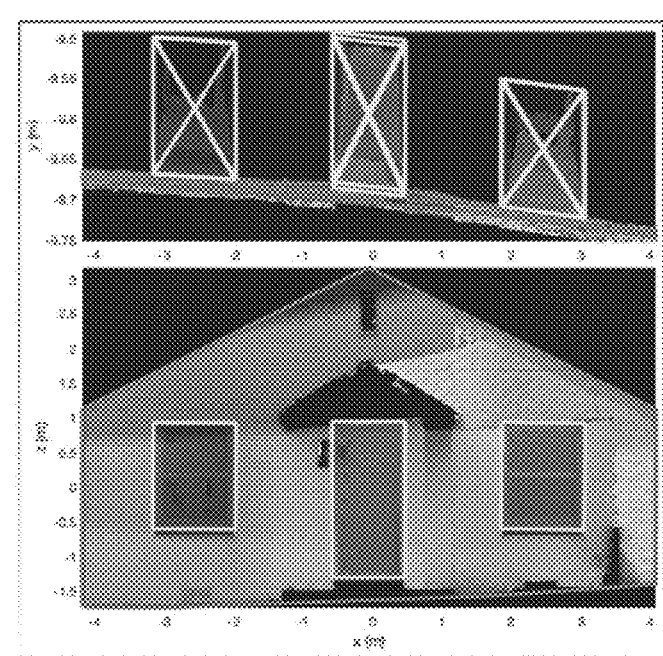
*Fig. 31*
Facade
stored as
convex
polygon

AUTOMATIC POINT CLOUD BUILDING ENVELOPE SEGMENTATION (AUTO-CuBES) USING MACHINE LEARNING

STATEMENT REGARDING FEDERALLY SPONSORED RESEARCH AND DEVELOPMENT

This invention was made with government support under Contract No. DE-AC05-00OR22725 awarded by the U.S. Department of Energy. The government has certain rights in the invention.

BACKGROUND OF THE INVENTION

The present disclosure relates to systems and methods for segmenting 3D point cloud data of building envelopes, specifically utilizing advanced techniques to assist in the identification and dimensioning of architectural features for retrofit applications.

Buildings are responsible for 30% of the total carbon dioxide emissions in the United States. To mitigate the impact of building operations on climate change, the application of energy codes in construction practices has reduced the energy use in buildings by more than 40% since their introduction in the 1980s. However, about 52% of residential and 46% of commercial buildings were built before energy codes. Hence, large energy savings can be achieved by retrofitting older buildings and bringing them up to code.

Overclad envelope retrofits using premanufactured components require precise measurements of the existing envelope to adequately design and manufacture the retrofit panels. Overclad envelope retrofits are an attractive solution since they reduce occupant disruption and shorten construction time at the job site. Current state-of-the-art retrofit panel design and sizing generally include three steps: 1) generating 3D point cloud data of the building envelope using commonly available surveying equipment, 2) manual segmentation of 3D point cloud data by a trained professional to identify and dimension window openings, door openings, wall protrusions, and other non-planar architectural features, and 3) optimizing the modular panel layout and dimensioning by an architect or engineer. The process of manually segmenting the point cloud data can be difficult and costly, often requiring third-party software and a trained professional to spend several man-hour-weeks depending on the size of the existing building. Additionally, after segmenting the point cloud into different components of the envelope, the position and size of each component (window, door, etc.) must be extracted from the point cloud, which often includes human-introduced errors due to the difficulty and tediousness of the process. Although commercially available software has been optimized to handle point clouds for manual segmentation, they do not offer automated feature identification and measurement extraction. The automation of these processes could save a significant amount of time and money while also reducing errors.

There is a need for improved systems and methods that assist in the segmentation of 3D point cloud data, thereby reducing the time, cost, and potential for errors associated with manual methods. Such improvements would facilitate more efficient and accurate retrofit panel design and installation.

SUMMARY OF THE INVENTION

The present disclosure is generally directed to improvements relating to prefabricated overclad panel retrofitting, where a new envelope is installed over the existing building. Embodiments of the current disclosure provide systems and methods for automatically labeling 3D point cloud data for retrofitting, significantly reducing the time and expense associated with manual segmentation. Unsupervised machine learning methods facilitate the classification of the point cloud data into distinct groups, each corresponding to different features of the building envelope. Following classification, a segmentation algorithm performs boundary detection and separates the components of the façade. The algorithm then automatically returns the relative positions and dimensions of the features within the building envelope. This automated segmentation reduces manual effort in 3D point cloud labeling prior to overclad panel layout optimization.

These and other objects, advantages, and features of the invention will be more fully understood and appreciated by reference to the description of the current embodiment and the drawings.

Before the embodiments of the invention are explained in detail, it is to be understood that the invention is not limited to the details of operation or to the details of construction and the arrangement of the components set forth in the following description or illustrated in the drawings. The invention may be implemented in various other embodiments and of being practiced or being carried out in alternative ways not expressly disclosed herein. Also, it is to be understood that the phraseology and terminology used herein are for the purpose of description and should not be regarded as limiting. The use of "including" and "comprising" and variations thereof is meant to encompass the items listed thereafter and equivalents thereof as well as additional items and equivalents thereof. Further, enumeration may be used in the description of various embodiments. Unless otherwise expressly stated, the use of enumeration should not be construed as limiting the invention to any specific order or number of components. Nor should the use of enumeration be construed as excluding from the scope of the invention any additional steps or components that might be combined with or into the enumerated steps or components. Any reference to claim elements as "at least one of X, Y and Z" is meant to include any one of X, Y or Z individually, and any combination of X, Y and Z, for example, X, Y, Z; X, Y; X, Z; and Y, Z.

BRIEF DESCRIPTION OF THE DRAWINGS

FIGS. 26-31 illustrate steps for an embodiment of an Auto-CuBES method.

DESCRIPTION OF THE CURRENT EMBODIMENT

Figure 1:
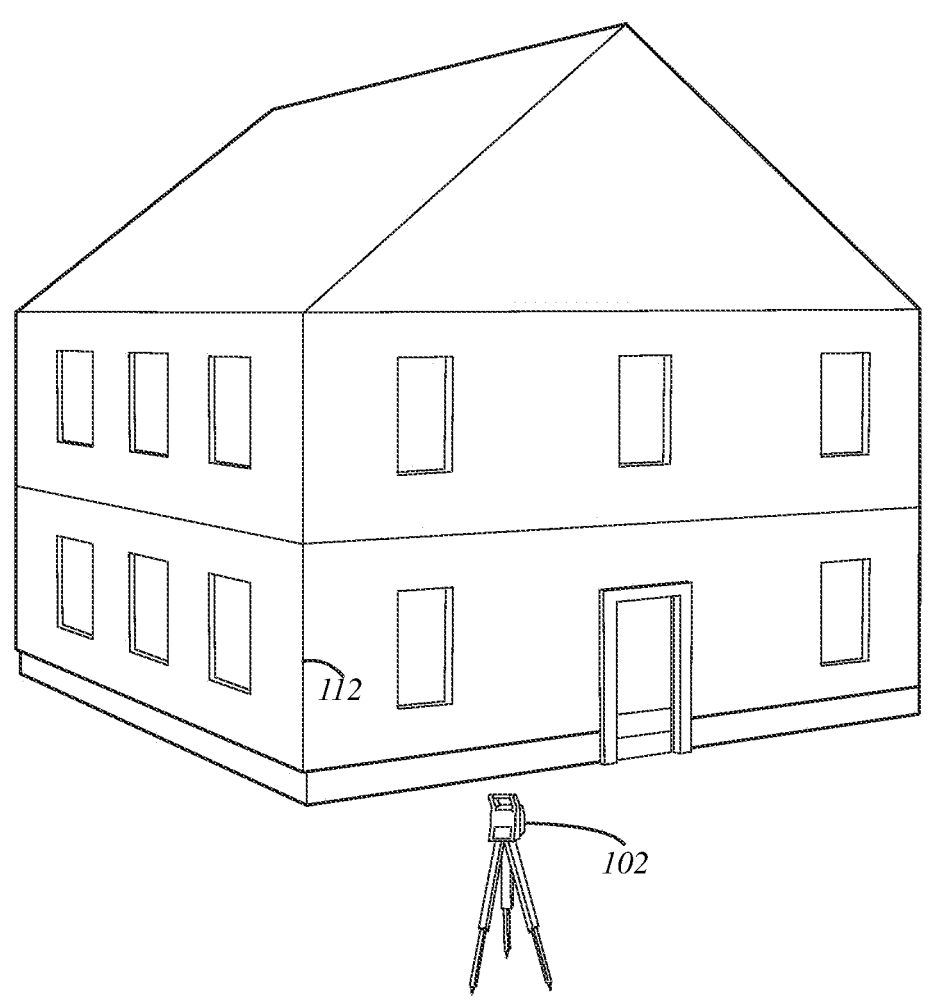
FIG. 1 illustrates an exemplary LiDAR device for scanning a building envelope to generate a point cloud.

The present disclosure is generally directed to improvements relating to prefabricated overclad panel retrofitting, where a new envelope is installed over the existing building. Embodiments of the current disclosure provide systems and methods for automatically labeling and segmentation of 3D point cloud data for retrofitting, significantly reducing the time and expense associated with manual segmentation. Unsupervised machine learning methods facilitate the classification of the point cloud data into distinct groups, each corresponding to different features of the building envelope. Following classification, a segmentation algorithm performs boundary detection and separates the components of the façade. The algorithm then returns the relative positions and dimensions of the features within the building envelope. This automated segmentation significantly reduces manual effort required for 3D point cloud labeling prior to overclad panel layout optimization.

Recent advances in machine learning have enabled the development of automatic segmentation algorithms for extracting building envelope features. Common practices include the use of photogrammetry (RGB cameras) data or a combination of photogrammetry and light detection and ranging (LiDAR) data. Although such algorithms can identify the locations and dimensions of windows and doors, they are limited to the resolution of the camera (~10 s of mm) and might not achieve the millimetric accuracy needed for retrofit panel design. Deep learning techniques that analyze LiDAR data for point cloud segmentation are capable of automatically identifying the constituent components of common objects. However, this generally requires a large amount of correctly labeled points for training neural networks. For the segmentation of large structures, the scarcity of training samples and inaccurate boundary segmentation have limited the scope of their usage. For building envelope segmentation specifically, supervised learning techniques are not practical because of the time and cost to obtain suitable training data. Moreover, the variety and uniqueness of façade topologies exacerbate the real-world training sample scarcity problem. The present disclosure provides semi-automated segmentation algorithms that leverage unsupervised machine learning that does not need training data for the building envelope segmentation task.

Specifically, the present disclosure provides several embodiments of an Automatic point Cloud Building Envelope Segmentation (Auto-CuBES) algorithm based on unsupervised machine learning that can automatically label 3D point cloud data and reduce the time spent in manual segmentation. The Auto-CuBES algorithms can process high-resolution point clouds and generate a wireframe building envelope model with a small set of calibration parameters.

The Automatic point Cloud Building Envelope Segmentation (Auto-CuBES) algorithm improves automation of the segmentation of 3D point cloud data, significantly reducing the time and expense associated with manual segmentation. The algorithm processes point cloud data to generate a wireframe building envelope model using a small set of calibration parameters. The general steps of the Auto-CuBES algorithm include identifying and extracting individual facades of the building, identifying and extracting facade features such as doors and windows, removing outliers from the point cloud data, and generating a wire-frame model of the building envelope.

Figure 19:
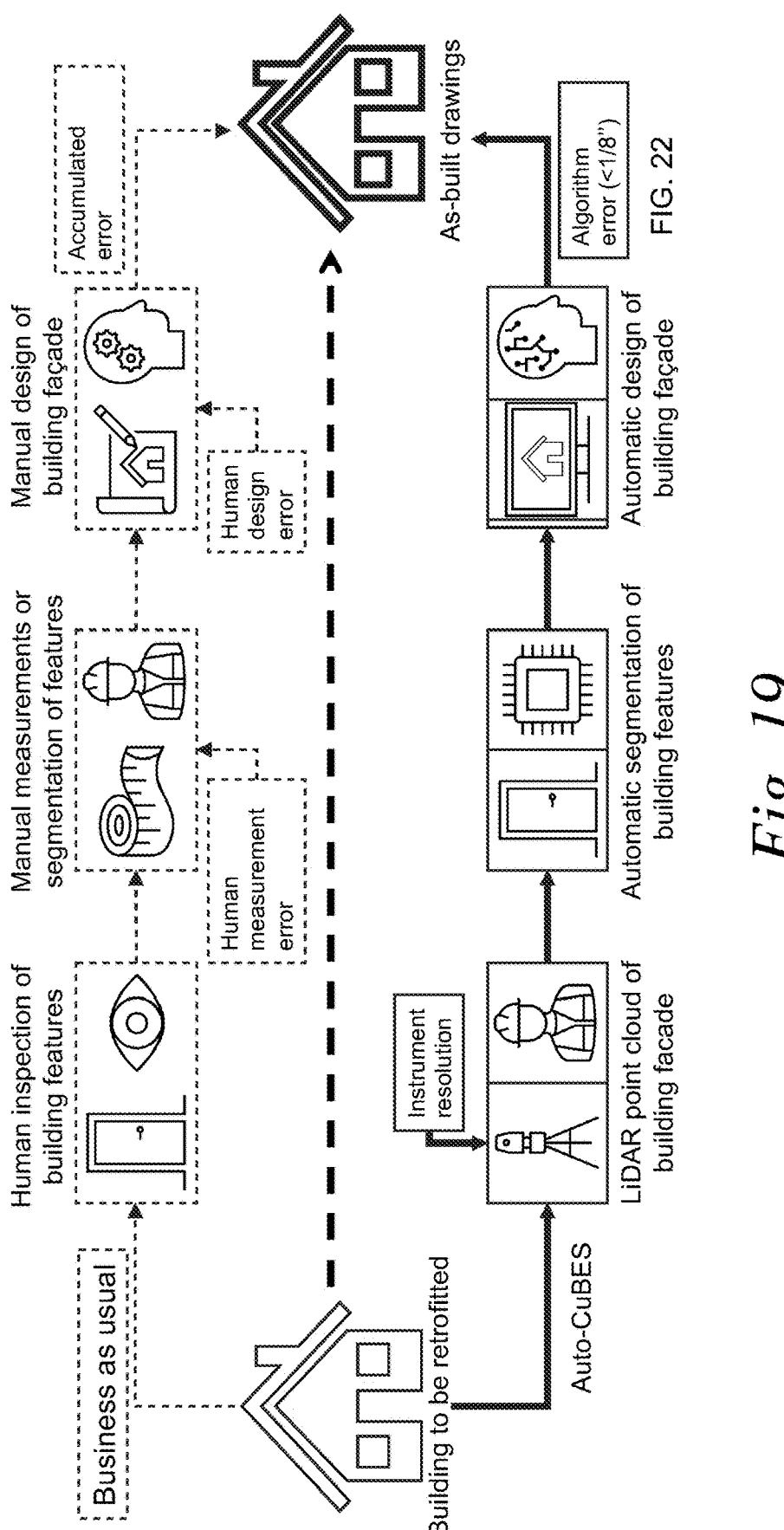
FIG. 19 illustrates a comparison between manual segmentation and Auto-CuBES methods.

FIG. 19 illustrates a comparison between manual segmentation and Auto-CuBES methods. During traditional segmentation, human inspection and manual measurements are done, which introduce human measurement error. These measurement errors can be further exacerbated by manual design of the building façade, which can introduce further human design error. Auto-CuBES utilizes LiDAR to capture a point cloud of a building façade along with automatic segmentation of building features using unsupervised machine learning. Further the design and shape of the building façade can be generated automatically (e.g., a wireframe model) that has less than $\frac{1}{8}$ inch of error.

Figure 20:
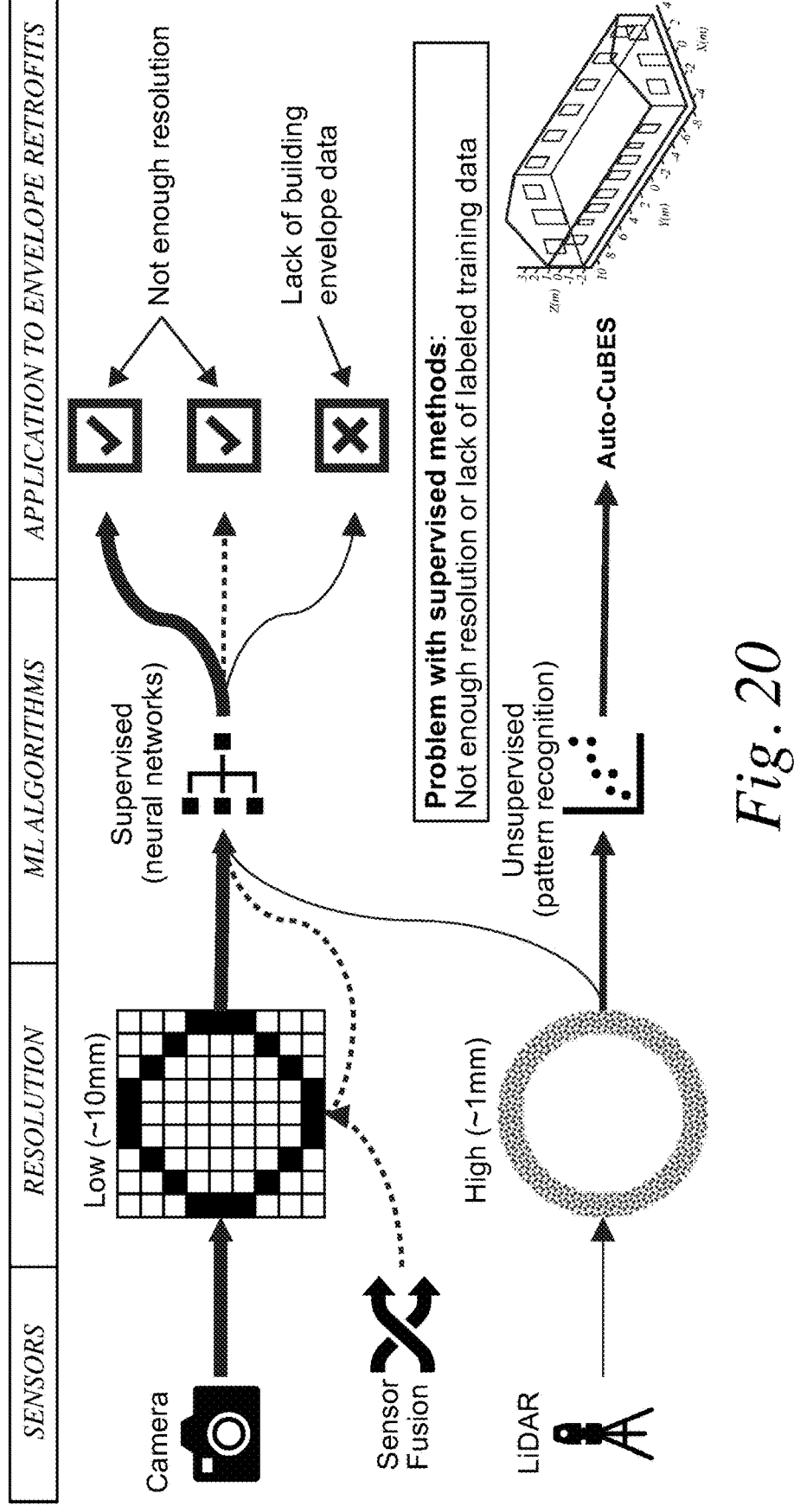
FIG. 20 illustrates a comparison between previous supervised methods and the unsupervised Auto-CuBES methods.

FIG. 20 illustrates a comparison between previous supervised methods and the unsupervised Auto-CuBES methods. Some supervised methods for developing envelope retrofits exist. These systems utilize cameras with low resolution, sensor fusion, and supervised machine learning algorithms. However, these methods are generally flawed because there is not enough resolution in the image data or there is a lack of labeled training data for the supervised machine learning to be effective.

Various instruments can be utilized to collect point cloud data, such as a total station or terrestrial laser scanner. A total station is a surveying instrument that integrates an electronic theodolite with an electronic distance meter to measure angles and distances. Some advanced total stations incorporate light detection and ranging (LiDAR) technology to capture 3D point cloud data. A terrestrial laser scanner (TLS) is a type of LiDAR system specifically designed for ground-based, stationary scanning. TLS instruments can be used to capture high-resolution 3D point clouds of the surrounding environment.

Figure 9:
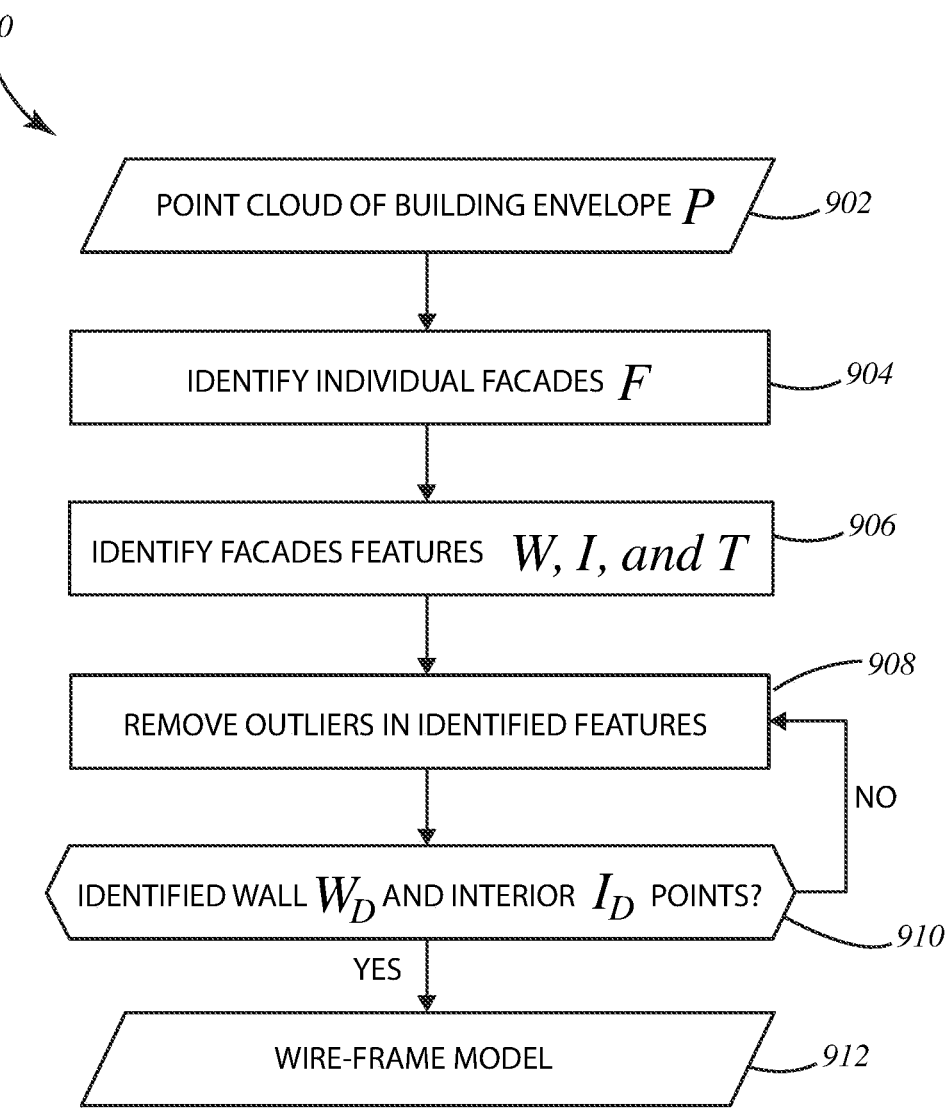
FIG. 9 illustrates a flowchart of one embodiment of an Auto-CuBES algorithm.

FIG. 9 shows a flowchart 900 of one embodiment of an automatic point cloud building envelope segmentation algorithm. The algorithm converts an input point cloud file 902 into an output wire-frame model 912. In contrast to deep learning methods where layers of neurons are placed between inputs and outputs, unsupervised methods are typically divided into sequential tasks. Each task has its own set of calibration parameters, however many of them may not need to be recalibrated for different input files. In general, the steps of the algorithm include identifying individual facades 904, identifying features of the facades 906, removing outliers in the identified features 908, deciding whether wall and interior points are sufficiently identified 910, and generating the wire-frame model based on the processed point cloud data 912. The removal of outliers and identification of wall and interior points may be an iterative process that involves recalibration based on a level of accuracy defined by the user. Steps of the Auto-CuBES including the unsupervised machine learning methods, calibration parameters, and results of each tasks will now be discussed.

FIG. 1 illustrates one exemplary scanning robotic total station 102, such as the Leica MS60 MultiStation. The Leica MS60 MultiStation is a precision surveying instrument that combines traditional total station functionality with LiDAR technology. It integrates precise angle and distance measurement capabilities with high-speed laser scanning, enabling the collection of detailed 3D point cloud data. The LiDAR functionality of the Leica MS60 allows it to capture millions of points per second, creating dense and accurate point clouds that represent the surveyed environment. These point clouds can be used to generate detailed 3D models of buildings, landscapes, and other structures.

Figure 2:
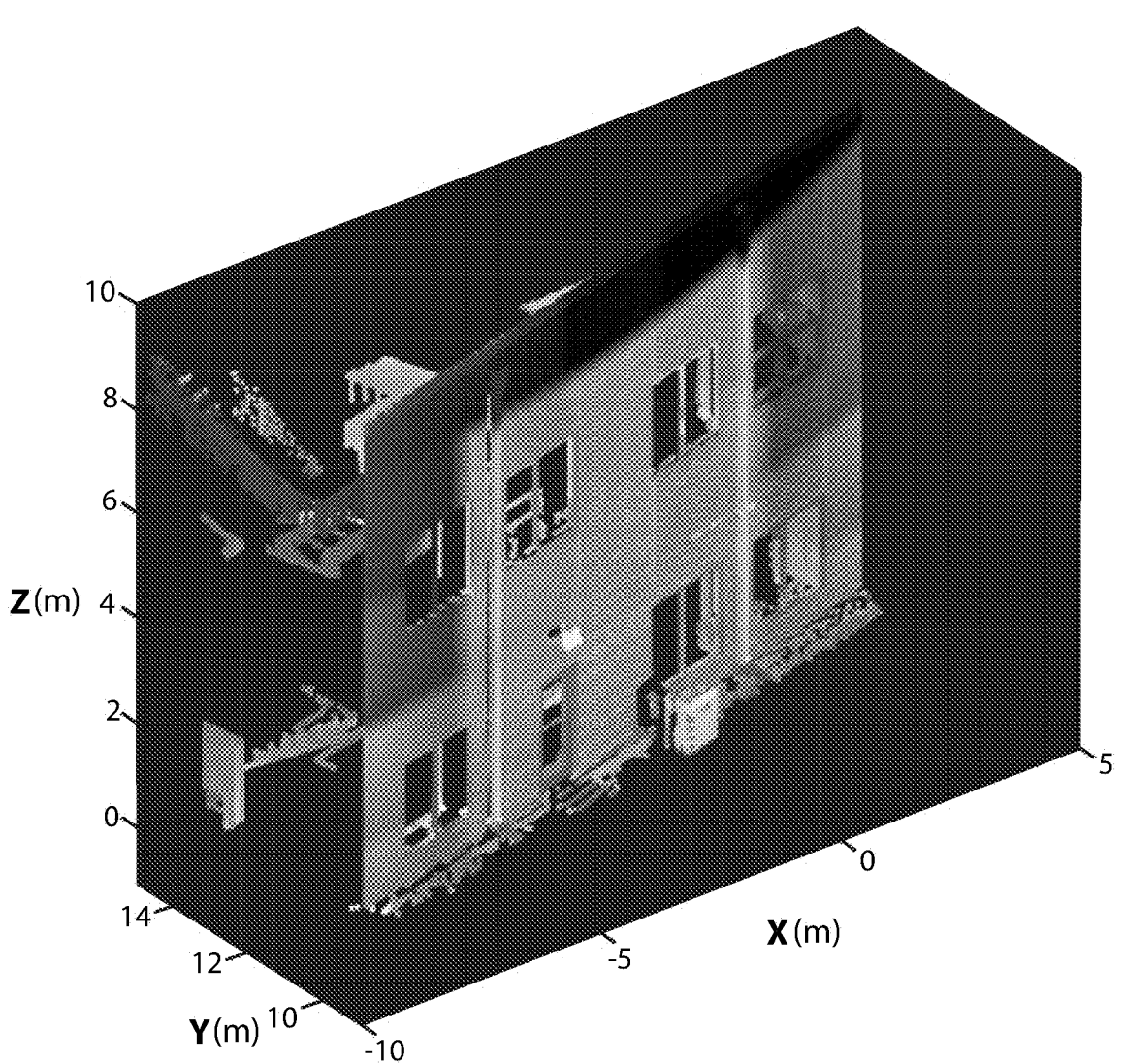
FIG. 2 depicts raw point cloud data from a LiDAR scan of a building facade.

One exemplary visualization of a 3D point cloud data set of a building façade is illustrated in FIG. 2. This 3D point cloud data represents one face of a two-story brick building with aluminum window frames and an aluminum door frame. The coordinates are depicted on a 3-axis graph to visualize the data. Each point in this point cloud data is made up of seven parameters:

$$p_i = \{x_i, y_i, z_i, L_i, r_i, g_i, b_i\}$$

In this particular set of 3D point cloud data, each point includes cartesian coordinates, light intensity, and color values. In this particular set of 3D point cloud data, each point $p_i$ includes Cartesian coordinates $(x_i, y_i, z_i)$, light intensity $(L_i)$, and color values $(r_i, g_i, b_i)$, where $r_i$, $g_i$, and $b_i$ represent the red, green, and blue color components, respectively. The point cloud data can also be represented in the form $P=[P\ L\ C]$ where $P=[x\ y\ z]$ are the rectangular coordinates, L is the LiDAR intensity recorded as the return strength of a laser beam, and $C=[r\ g\ b]$ are the corresponding pixel colors obtained from the camera.

These parameters are merely exemplary, and the disclosure is not limited to this specific set of 3D point cloud parameters. Other embodiments may include additional or alternative 3D point cloud parameters, such as coordinates using alternative coordinate systems, reflectivity values, or time of flight values, depending on the specific requirements and capabilities of the data collection system used to collect the 3D point cloud dataset. While the point cloud data is illustrated in FIG. 2 and other figures throughout the disclosure it should be understood that these are merely visual representations of the 3D point cloud data. The 3D point cloud data can be saved and manipulated in memory. For example, the point cloud data can be saved in essentially any suitable point cloud file format, such as a PTS file. PTS is a common file format used to store and exchange 3D point cloud data, containing spatial coordinates and often additional attributes such as intensity and color values.

Figure 10:
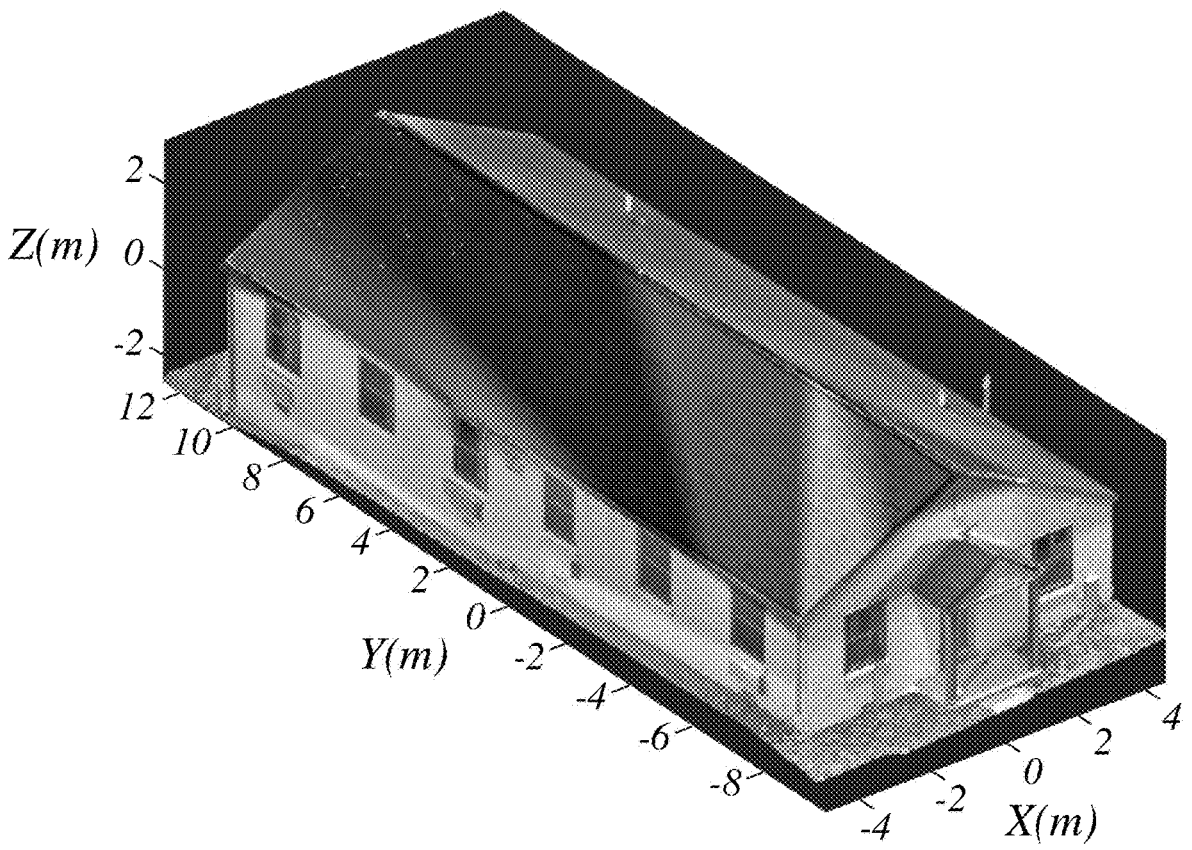
FIG. 10 illustrates an exemplary visualization of a set of point cloud data of a residential building envelope.

The underlying point cloud data depicted in FIG. 2 can be obtained by positioning a total station at ground level, generally perpendicular to the target façade. By laser scanning the façade, point cloud data points that collectively provide information about the various openings (e.g., windows and doors) on the façade can be captured. This 3D point cloud data can be exported and saved in the .PTS format or another suitable format. For example, a duplex residential house can be scanned by placing the LiDAR scanner in front of each façade and stitching the scans together using four control points located near the corners of the building. FIG. 10 shows an exemplary resulting point cloud. The point cloud encompasses a total of 32.2 million points with an average distance of 3 mm between points.

It is worth noting that the scanning of the building façades can be conducted at various resolution levels. For example, multiple laser scans of a façade can be performed at different resolutions (e.g., 1", ½", ¼", and ⅛" resolutions). The particular resolution can be selected based on the various trade-offs for conducting the scanning at higher or lower resolutions. In general, higher resolution scanning will provide more point cloud data that may allow for more accurate analysis and results, while lower resolution scanning will generally be faster.

Note that exterior features formed by the front of the façade, as well as the visible interior features behind the windows, are generally part of the point cloud data. Therefore, besides identifying façade openings, a successful automated algorithm will also reduce the point cloud data to eliminate the unnecessary or distracting point cloud data. Such an algorithm can be implemented using essentially any suitable point cloud analysis tool. For example, in some embodiments, the Statistics and Machine Learning Toolbox of MATLAB can be utilized for point cloud analysis on a computer.

Figure 3:
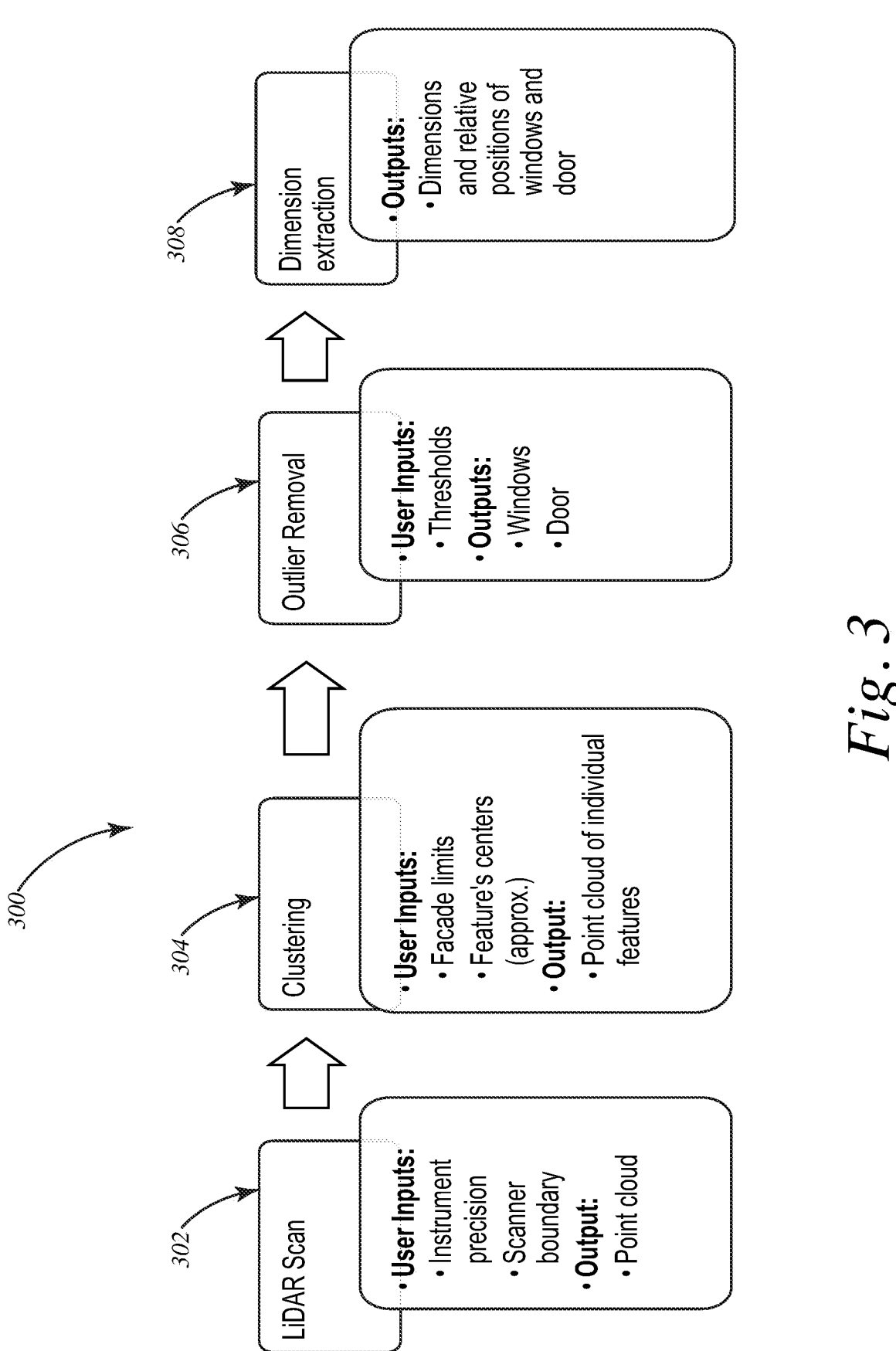
FIG. 3 illustrates a flowchart depicting an exemplary Auto-CuBES process including LiDAR scanning, clustering, outlier removal, and dimension extraction.

One embodiment of an algorithm for automatic point cloud building envelope segmentation (Auto-CuBES) is illustrated by the flowchart depicted in FIG. 3. The process 300 generally includes a LiDAR scan to obtain point cloud data associated with a building façade 302, clustering the point cloud data into façade features 304 (e.g., openings), outlier removal based on user defined thresholds 306, and dimension extraction 308. The Auto-CuBES process can provide faster and more accurate dimensions and relative positions of windows and doors than conventional dimensioning techniques.

A number of parameters may be selected in connection with the LiDAR scanning, such as instrument precision parameters (e.g., resolution), scanner boundaries, and other scanning parameters. The resultant output of the LiDAR scan is a set of point cloud data. The point cloud data may include one or more facades The clustering 304 identifies different building features based on the materials, such as the identification of brick walls and aluminum window frames. The outlier removal 306 removes possible outliers from each façade opening. And the dimension extraction 308 finds the bounding box enclosing the individual point clouds to extract the width, height, and relative positions.

User input can be utilized throughout the Auto-CuBES process, however, the clustering, outlier removal and dimension extract steps reduce the amount of user interaction and manual labor needed to obtain building dimensions over traditional methods. Further, while machine learning can be utilized in some of these steps, machine learning expertise is not required to assist the algorithm in the process. The following sections detail one embodiment of a method for analyzing point cloud data, performing some cleanup, and ultimately extracting building façade dimensions, including which sections of the façade are windows, doors, or wall.

Figure 4:
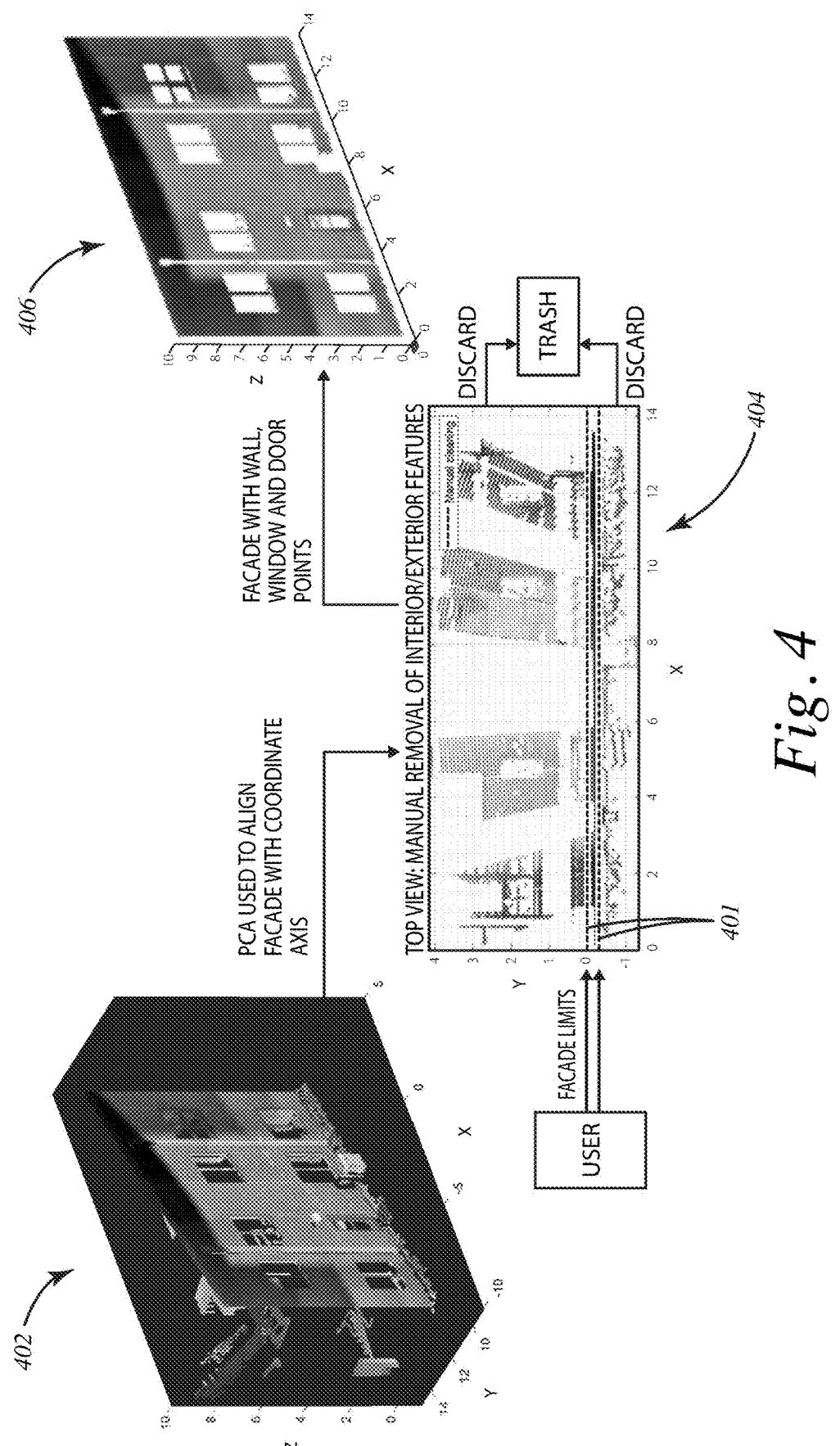
FIG. 4 illustrates the alignment and identification of façade points using Principal Component Analysis (PCA).

FIG. 4 illustrates a graphic representation of point cloud cleanup after the initial raw point cloud data has been scanned. This process can be utilized to define and orient the point cloud data related to the particular façade being analyzed. Principal component analysis (PCA) orientation can be used to identify and align a point cloud façade with suitable coordinate axes (e.g., the x-z plane of the facade). For example, to facilitate removal of unnecessary points from the initial raw scan of 3D point cloud data, PCA can be used to automatically align the building's façade with the x-z plane. 3D plot 402 of FIG. 4 shows a 3D view of the raw point cloud data while plot 404 shows a top view of the rotated façade according to a reoriented coordinate system where the x-z plane is aligned with one of the building façades. This can be repeated for each façade of the building.

The two dashed horizontal lines 401 depict user-defined limits for the façade. These lines can be set via a user interface presented to the user on a computer executing the Auto-CuBES algorithm. All point cloud data between these lines 401 is part of the subject façade and can be preserved for analysis. Such limits do not need to be exact. These thresholds can be set by the user as part of the process of analyzing the point cloud data to arrive at the façade dimensions. The plot 406 of FIG. 4 shows the resultant point cloud data used for analysis, i.e., the point cloud data between the two horizontal dashed lines 401. The points outside the user-defined limits can be discarded or hidden from view.

Figure 5:
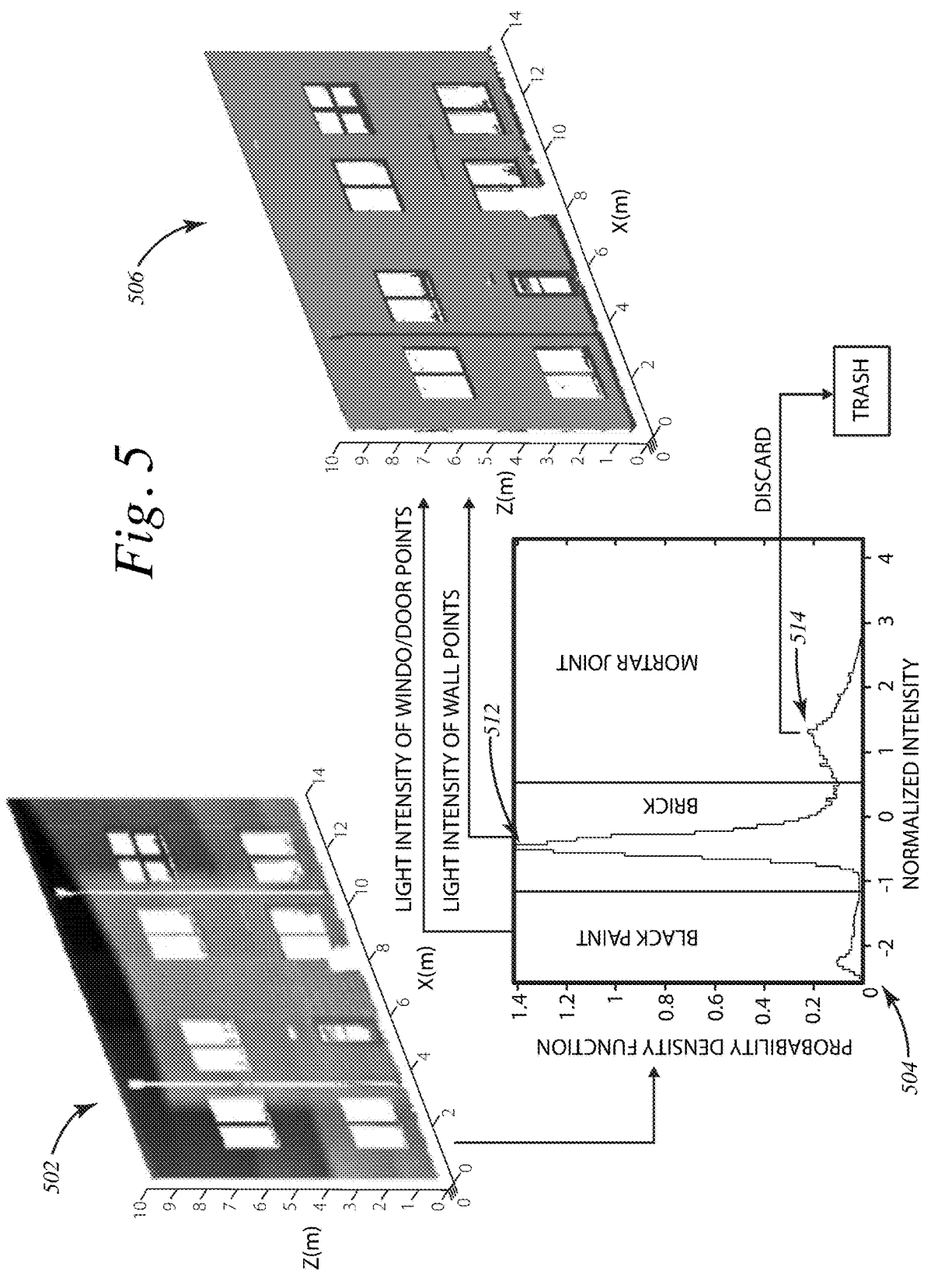
FIG. 5 illustrates a clustered histogram of normalized light intensity (x-axis) and the corresponding probability density function (y-axis) for building façade segmentation along with showing how the clustering is applied to a separate wall points from window points.

After the façade is identified and the unnecessary points removed and the resultant point cloud data is saved in memory (e.g., as a .PTS file), segmentation can be performed using the light intensity component of the .PTS file due to its usefulness for material discrimination. The plot 504 of FIG. 5 shows a histogram of normalized (zero mean and unit variance) light intensity for the PCA oriented façade 502. This plot of normalized intensity against the probability density function 504 shows normalized light intensity clustered into a multimodal distribution, specifically three groups for this exemplary façade.

The multimodal distribution of this histogram 504 is due to the variety of materials present in the façade. The leftmost peak 510 of the histogram corresponds mainly to the window frames and opening features, but it also includes the door and ground features. The center peak 512 of the histogram corresponds to the brick, and the right peak 514 of the histogram corresponds mainly to mortar joints. The user manually analyzes the histogram data to determine the number of clusters (k) by identifying and associating the peaks with specific features. In general, the largest mode will correspond to the most abundant material. In the case of the example, the largest mode 512 correspond to the brick wall. The windows and door frames in the exemplary façade are made of aluminum and painted black, which correspond to a low reflectivity and corresponds to the mode with the lowest intensity 504. A k-means clustering algorithm can then partition the point cloud data into these distinct groups based on the intensity values. In this example, the user determined that the point cloud data should be partitioned into three distinct groups. The plot 506 shows a presentation of the resultant segmented point cloud data with the mortar joint data discarded.

Figure 6:
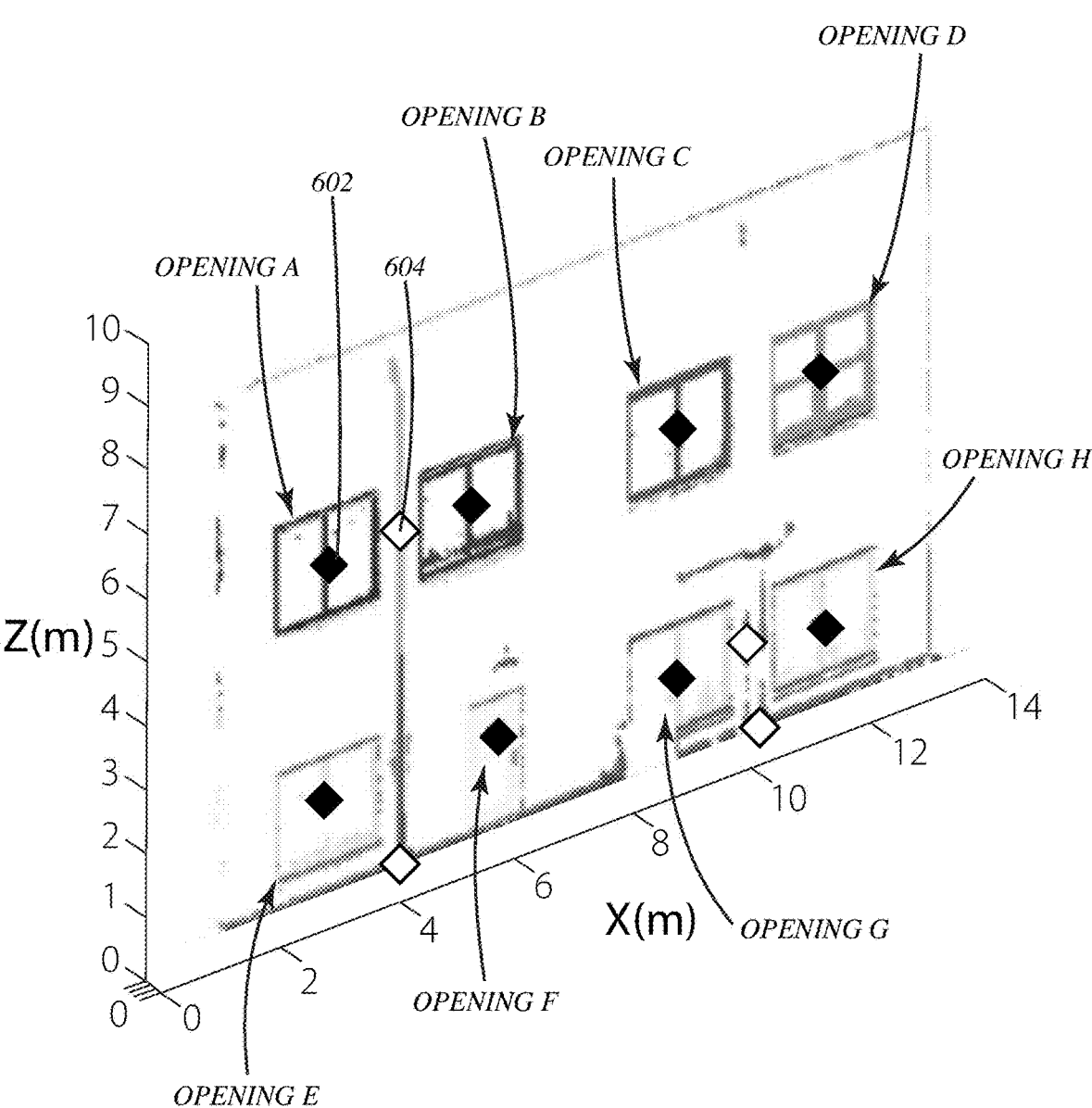
FIG. 6 illustrates results after semi-supervised clustering for identifying individual façade openings.

As shown in FIG. 6, the point cloud data corresponding to the opening features can be further classified, for example using k-medoids clustering. The k-medoids clustering algorithm has the user specify the number of clusters (k) as an input using heuristics. As part of the process, the user is presented with a visualization of the façade and the ability to specify clusters by placing markers (e.g., diamonds) at the center of each user-selected cluster. In the depicted example, the user placed 11 markers 602, which causes the k-medoids clustering to produce 11 distinct clusters of point cloud data: 7 for windows, 1 for the door, and 4 clusters to remove unnecessary points (e.g., downspouts) that can pose potential issues for later steps. The final partitioning depends strongly on the initial location of the medoids selected by the user using this semi-supervised version of k-medoids clustering. FIG. 6 shows the openings clustered and labeled with letters A-H. The black diamonds 508 show the user-selected points used as initial conditions for the k-medoids algorithm. Note that each individual cluster corresponds to an opening in the façade or a set of outlier points. Some clusters have incorrectly identified points (e.g., points of the window's stool) that need to be removed before the opening's dimensions can be calculated.

To extract the dimensions of windows and doors, the points corresponding to the opening features are passed to a dimension extraction routine. To prepare the clusters of point cloud data for this step, an outlier removal algorithm can be applied to each cluster to remove unnecessary points that can alter the dimensions of windows and doors. In one embodiment the following global and local outlier removal steps can be taken:

1. Global outlier removal using a $\chi^2$ hypothesis test based on the Mahalanobis distance.

2. Local outlier removal using the Local Distance-Based Outlier Detection Factor (LDOF).

Essentially any global outlier removal algorithm can be utilized. In the current embodiment, the global outlier removal uses a Mahalanobis distance for discrimination, calculated as follows:

$$D_M(x) = (x - \mu)^T S^{-1} (x - \mu) \qquad (1)$$

Here, $x \in \mathbb{R}^7$ is an element in the point cloud and $\mu$, S are the estimated mean vector and covariance matrix. If the Mahalanobis distance is normally distributed, then $D_M$ has a $\chi^2$ distribution with 7 degrees of freedom. The $\chi^2$ hypothesis test can be used to remove outlier points with relatively high $D_M$. The thresholds for what is considered relatively high can be selected by the user and suitable default values can be provided.

Essentially any local outlier detection algorithm can be utilized. In the current embodiment, for each spatial point $p_i \in \mathbb{R}^3$ in the point cloud, the set of neighboring points $\{n_j\}$ can be found using a three-dimensional Delaunay triangulation. Then, the local distance-based outlier detection factor can be calculated as follows:

$$LDOF = \mathbb{E}[D_M(p_i, n_j)] / \mathbb{E}[D_M(n_i, n_j)] \qquad (2)$$

In simple terms, the LDOF is the ratio between the average distance from all neighbors to $p_i$ and the average distance among all neighbors of $p_i$. If LDOF>1.3 then the point $p_i$ is too far from its neighbors and is considered a local outlier. The threshold value of 1.3 for the LDOF can be selected based on empirical observations or domain-specific knowledge by the user. It can be adjusted depending on the specific application and characteristics of the building façade point cloud data.

Figure 7A:
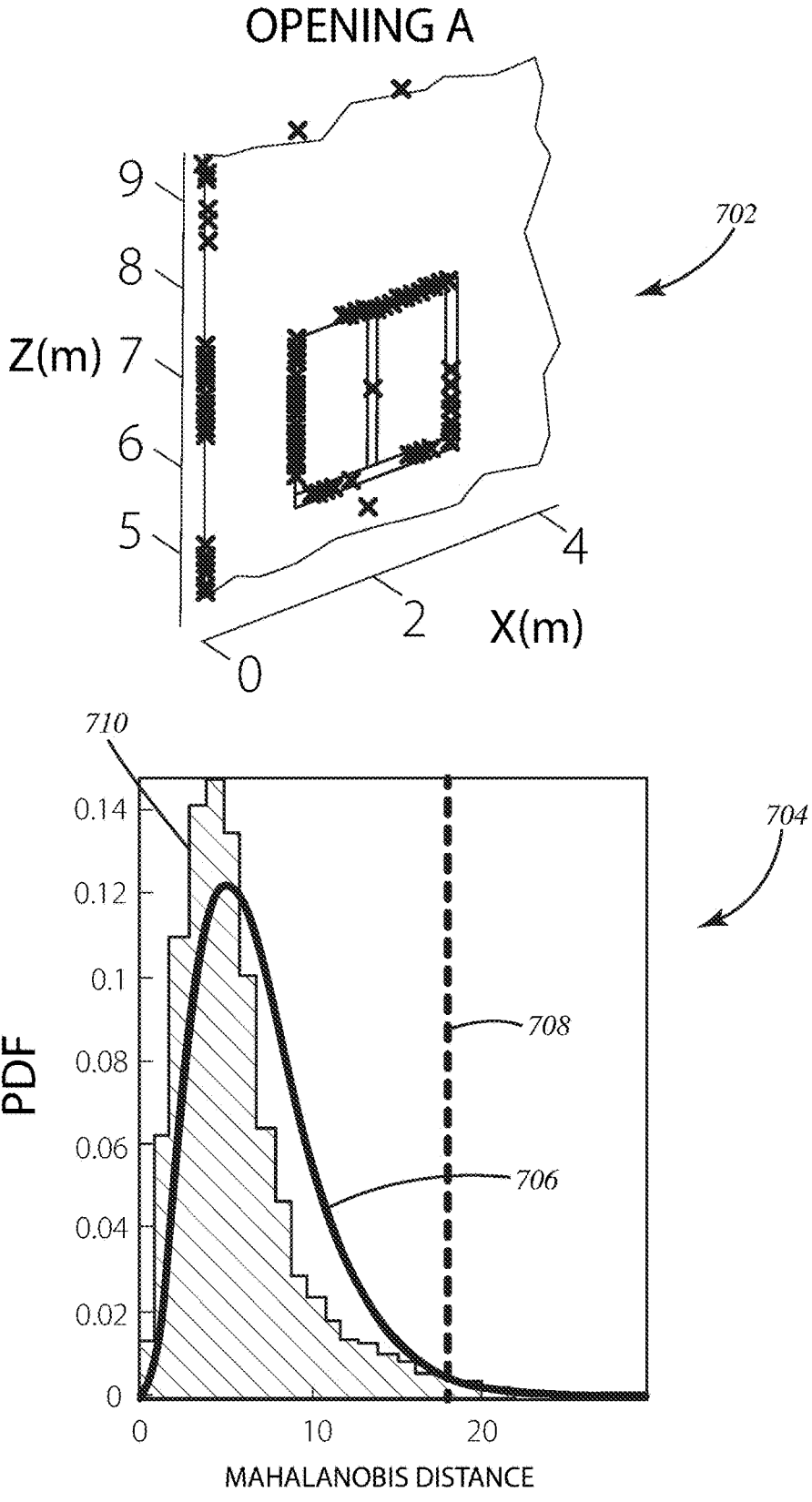
FIG. 7A illustrates global outlier removal for an exemplary opening.

FIG. 7A shows exemplary results of global and local outlier removal applied to one of the façade openings (opening #1). The cluster plot 702 shows a visualization of the point cloud data of opening #1 while the shaded area 710 of graph 704 shows the probability density function (PDF) of $D_M(x)$ for the exemplary cluster. The black solid line 706 represents the theoretical $\chi^2$ distribution for the PDF. The dashed vertical line 708 shows the threshold used to identify points as global outliers. This threshold can be adjusted by the user for each individual opening. A conservative default threshold can be set to $$D_M^{thr}$$

such that $$Pr(D_M(x) > D_M^{thr}) = 0.001.$$

Figure 7B:
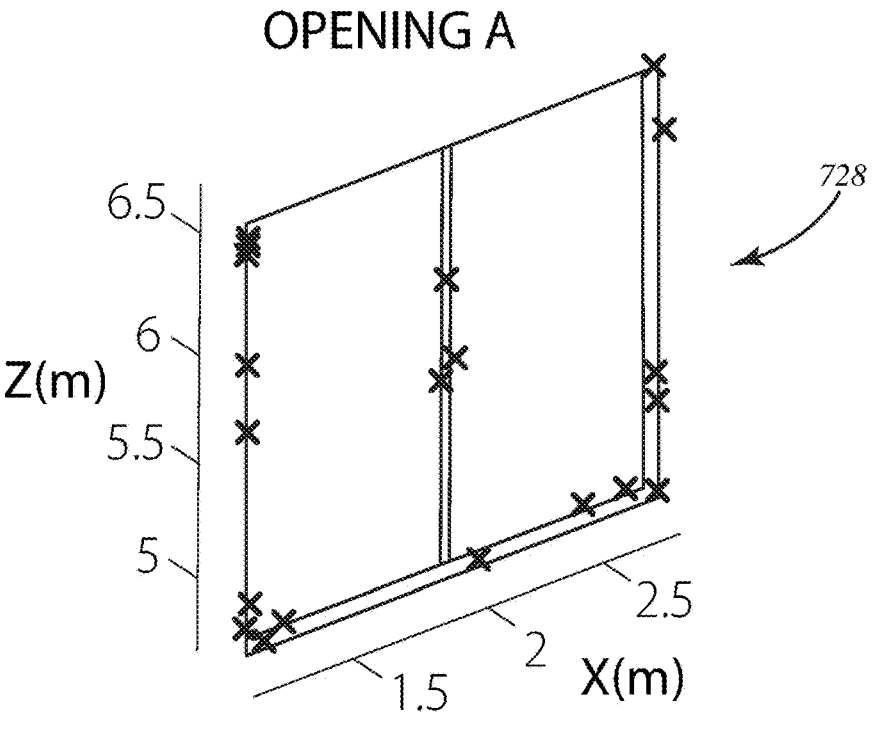
FIG. 7B illustrates local outlier removal for an exemplary openings.
Figure 7B:
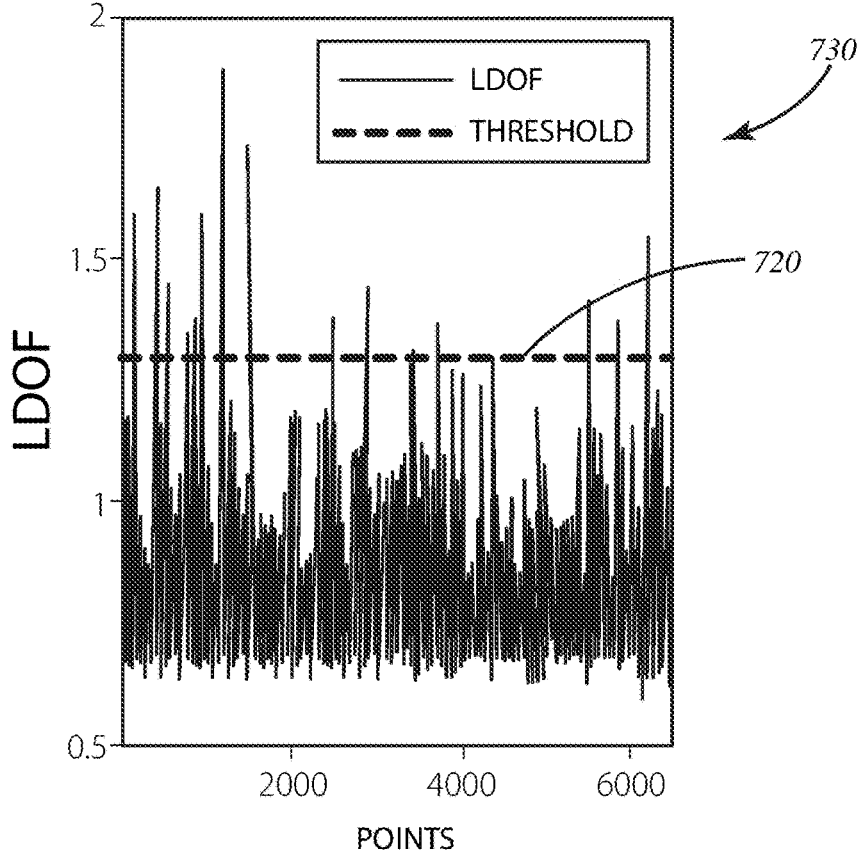

FIG. 7B shows point cloud data of an exemplary section of a façade 728 and a plot 730 depicting LDOF for each element, i.e. point, of the point cloud data of the opening A cluster. Plot 730 shows the subset of point cloud data in the building's window that corresponds to the points removed based on having a high LDOF, i.e., having an LDOF above the threshold 720. Once the global and local outliers of the point cloud data for the individual openings are removed, the dimensions can be estimated, e.g., assuming a rectangular shape.

Because the total station may not be positioned perfectly perpendicular to the target façade, the point cloud cannot be assumed to be perfectly aligned with the cartesian planes. Even though an initial PCA analysis generated a close alignment with the x-z plane, such alignment is not exact. The oriented minimum volume bounding box problem solves for the rectangular prism that encloses a point cloud while minimizing the volume of the prism. For this method, the algorithm uses such solution to calculate a rotation matrix to align the point cloud of a given opening with the x-z plane. By doing this, the dimensions and positions can be easily extracted by projecting over the x-z plane. Two exemplary algorithms can be used to solve the oriented minimum volume bounding box problem:

1. O'Rourke's algorithm: Corresponds to the geometrical solution of the problem. However, the time it takes to solve depends on the complexity of the convex hull of the point cloud data.

2. Hybrid Bounding Box Rotation Identification (HYBRID) algorithm: Solves an optimization problem significantly faster than O'Rourke's algorithm. The global minimum is not guaranteed but is often found.

Figure 8:
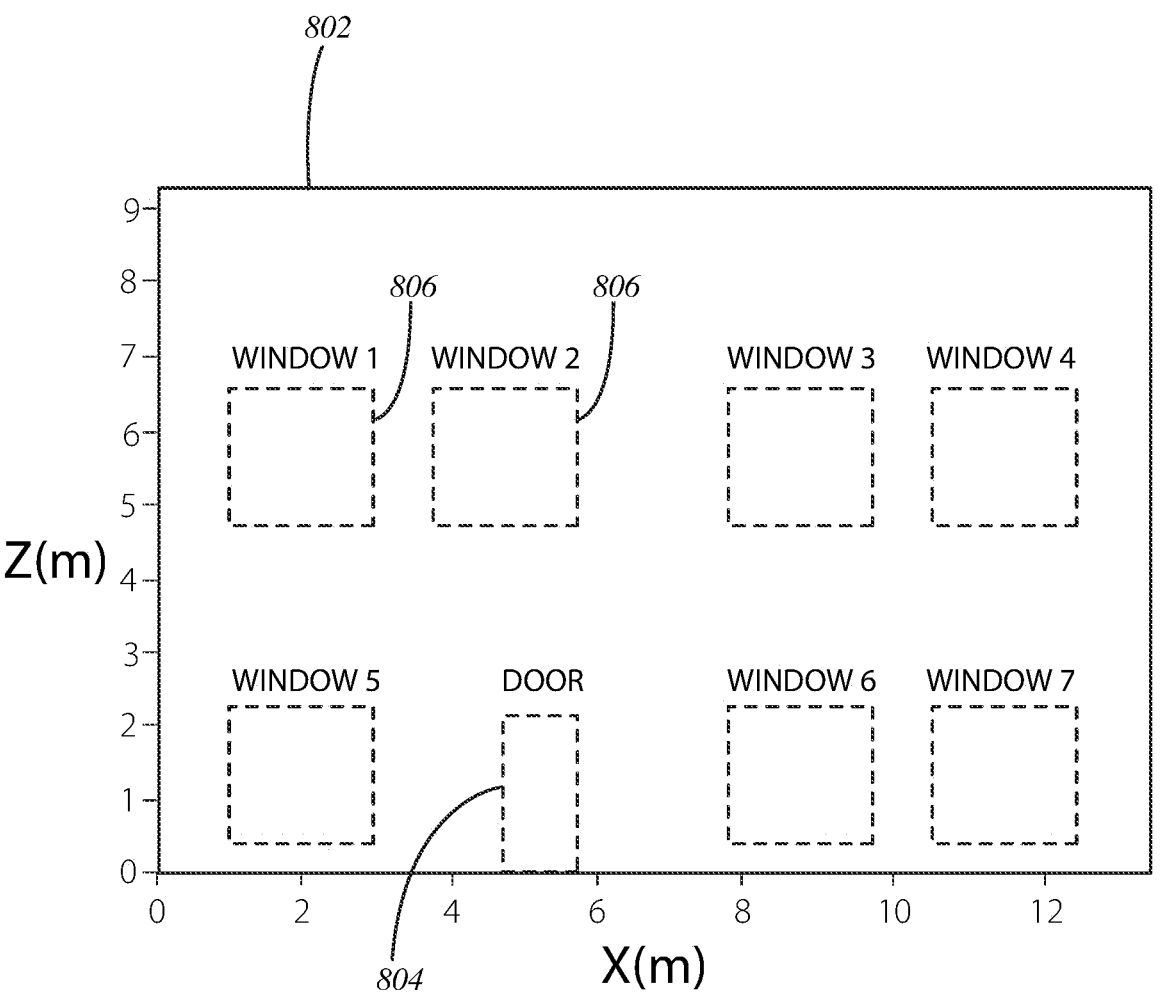
FIG. 8 illustrates an XZ component of oriented minimum volume bounding boxes enclosing the façade, door, and windows of the building.
Figure 21:
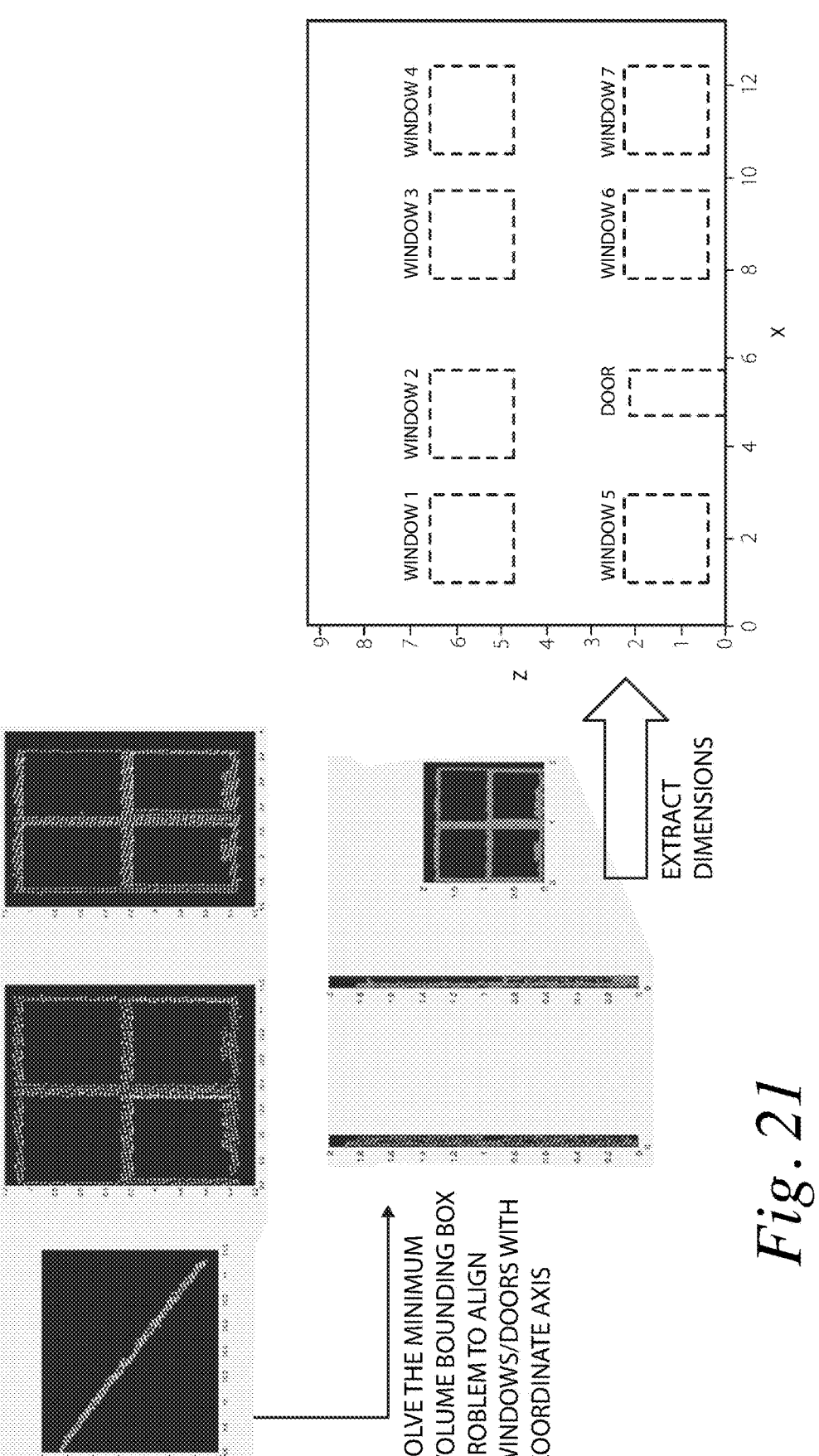
FIG. 21 illustrates dimension extraction by solving the minimum volume bounding box problem.

The O'Rourke and HYBBRID algorithms can be applied using MATLAB code or another suitable interface. After the bounding box of each individual opening is found, the point cloud can be rotated such that the largest face of the box (corresponding to the one parallel to the building face) aligns with the x-z plane. FIG. 21 and FIG. 8 shows the resulting XZ component of the bounding boxes for the entire façade 802, door 804, and windows 806.

The dimensions of the façade can be extracted after the face is aligned with the cartesian plane. At this point, a 2-dimensional wireframe drawing can be exported to DXF or another compatible file extension for architectural design and/or retrofit panel optimization.

The disclosed algorithm can be used to obtain the dimension of different scans with varying resolutions. For example, in one exemplary implementation the same façade was scanned using the Leica MS60 at 1", ½", ¼", and ⅛" resolution. Table 1 shows the total computation time (excluding the time from user inputs) used by the disclosed method at each resolution.

TABLE 1

| Resolution | 1" | ½" | ¼" | ⅛" |
|---|---|---|---|---|
| Computation time | 0 min 5 sec | 0 min 10 sec | 0 min 51 sec | 6 min 20 sec |

The algorithm takes less than 1 minute to process the up to ¼" resolution. However, at ⅛" resolution, the computational burden increases substantially, and the algorithm takes over 6 minutes to generate the results. As a comparison, manual measurements were taken using the same point cloud data taking a total time of 1 hour. This highlights the advantages of the Auto-CuBES method for reducing human labor, cutting construction costs, and increasing automation of panel retrofitting.

Although segmentation algorithms have been developed for photogrammetry data, cameras lack the high 3D resolution of laser scanners. For a survey-grade level of accuracy, the Auto-CuBES algorithm of the present disclosure segments 3D point cloud data into individual openings and extracts building façade dimensions and relative positions. The embodiments of the present disclosure provide a drastic reduction in processing time, from 1 h to 1 min, when compared to manual point cloud data segmentation. This is a substantial reduction even if multiple scans are processed using the algorithm to enhance accuracy.

Figure 22:
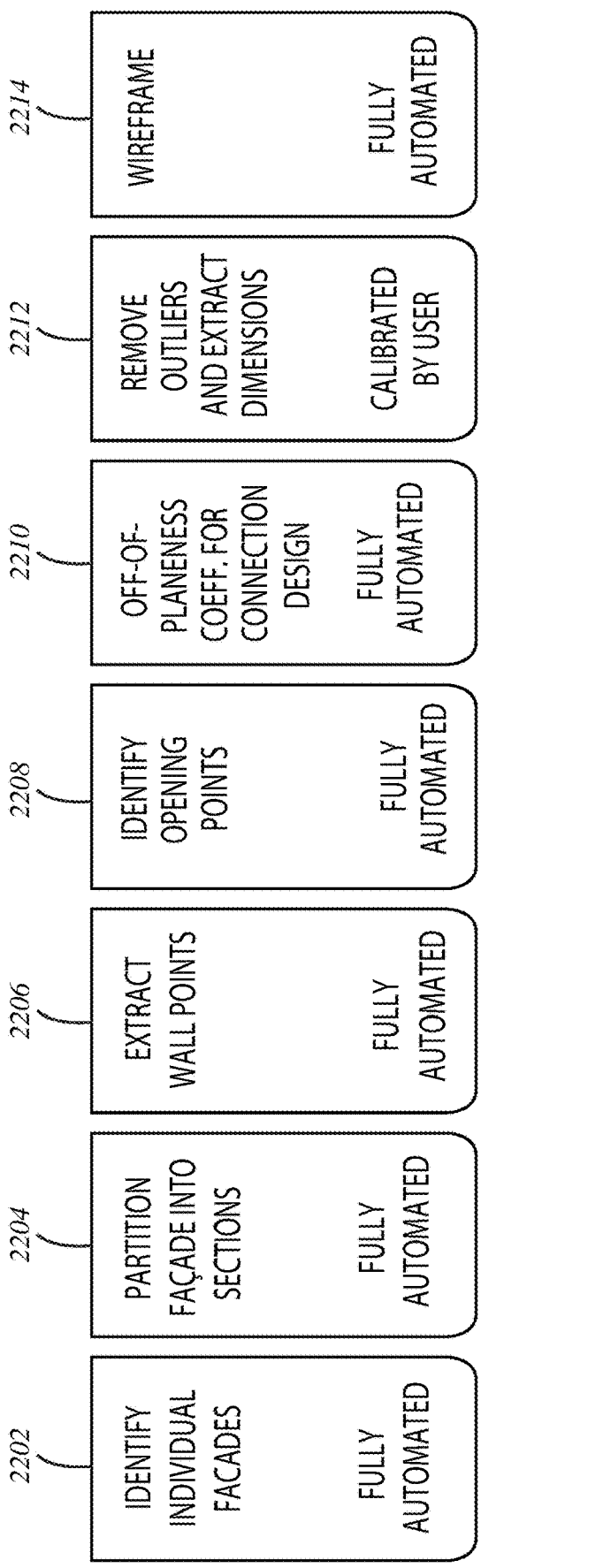
FIG. 22 illustrates an overview of another embodiment of an Auto-CuBES method.

Another embodiment of the Auto-CUBES algorithm will now be described in connection with FIGS. 22 and FIGS. 26-31. FIG. 22 illustrates a representative overview of the process that involves point cloud data, user calibration, and unsupervised machine learning to produce an accurate wireframe model of a building. In essence, a large amount of point cloud data (e.g., 32 million points) is converted into about 300 points that represent a digital twin wireframe model that can be exported to .DXF format. The process includes some portions that are fully automated and some that involve user calibration. To summarize, FIG. 22 provides a flowchart identifying the steps of this embodiment of the Auto-CuBES method. The steps include identifying individual facades 2202 (FIG. 26), partitioning each façade into separate sections 2204 (FIG. 27), extracting the façade features including wall points from each section 2206 (FIG. 28), extracting the façade features including opening points 2208 (FIG. 29), removing outliers and determining the off-of-planeness coefficient for connection design 2210 and 2012 (FIG. 30), and computing convex hull and bounding box to extract dimensions and generate a wireframe 2214 (FIG. 31). All of these steps can be fully automated with the exception of the removal of outlier step, where the user is involved to provide some calibration parameter adjustment to ensure the outlier removal is accurate.

The present disclosure provides significant improvements in the field of prefabricated overclad panel retrofitting by automating the segmentation of 3D point cloud data. This automation addresses the inefficiencies and inaccuracies associated with manual segmentation methods. The disclosed system leverages unsupervised machine learning algorithms to classify and segment point cloud data, transforming raw data into actionable, precise measurements used for retrofit panel design.

By using high-resolution LiDAR scans and advanced data processing techniques, the system ensures millimetric accuracy in identifying and measuring architectural features. This accuracy surpasses traditional photogrammetry methods limited by camera resolution and manual processing errors. The automated process reduces the need for manual intervention, reduces human error, and accelerates the retrofit design process, resulting in significant time and cost savings.

The bulk of this disclosure focuses on integration of physical scanning devices, such as LiDAR systems, with data processing apparatus that can implement the various data processing algorithms. This highlights the tangible interaction between the system and the physical world. The transformation of raw point cloud data into a detailed wireframe model of the building envelope is a concrete application that directly impacts the construction and retrofitting industry.

This embodiment begins by identifying the four facades of the building and removing the roof points. To achieve this, assuming that the LiDAR scanner was leveled, the point cloud can be rotated about the z-axis to align the walls with the x, y canonical basis. To determine the angle of rotation, a plan view of the envelope can be generated by selecting a subset of points corresponding to a section passing through the center of the building's height. In other words, the plan view of the envelope is the set $$E = \{[x \ y \ z] \in P \mid |z - \mathbb{E}[z]| < \delta\} \quad (2)$$

Here, $\mathbb{E}[\cdot]$ is the expected value function and $\delta=0.4$ m is a calibration parameter. The rotation angle can be calculated by solving the minimum-volume oriented bounding box problem.

Figure 11:
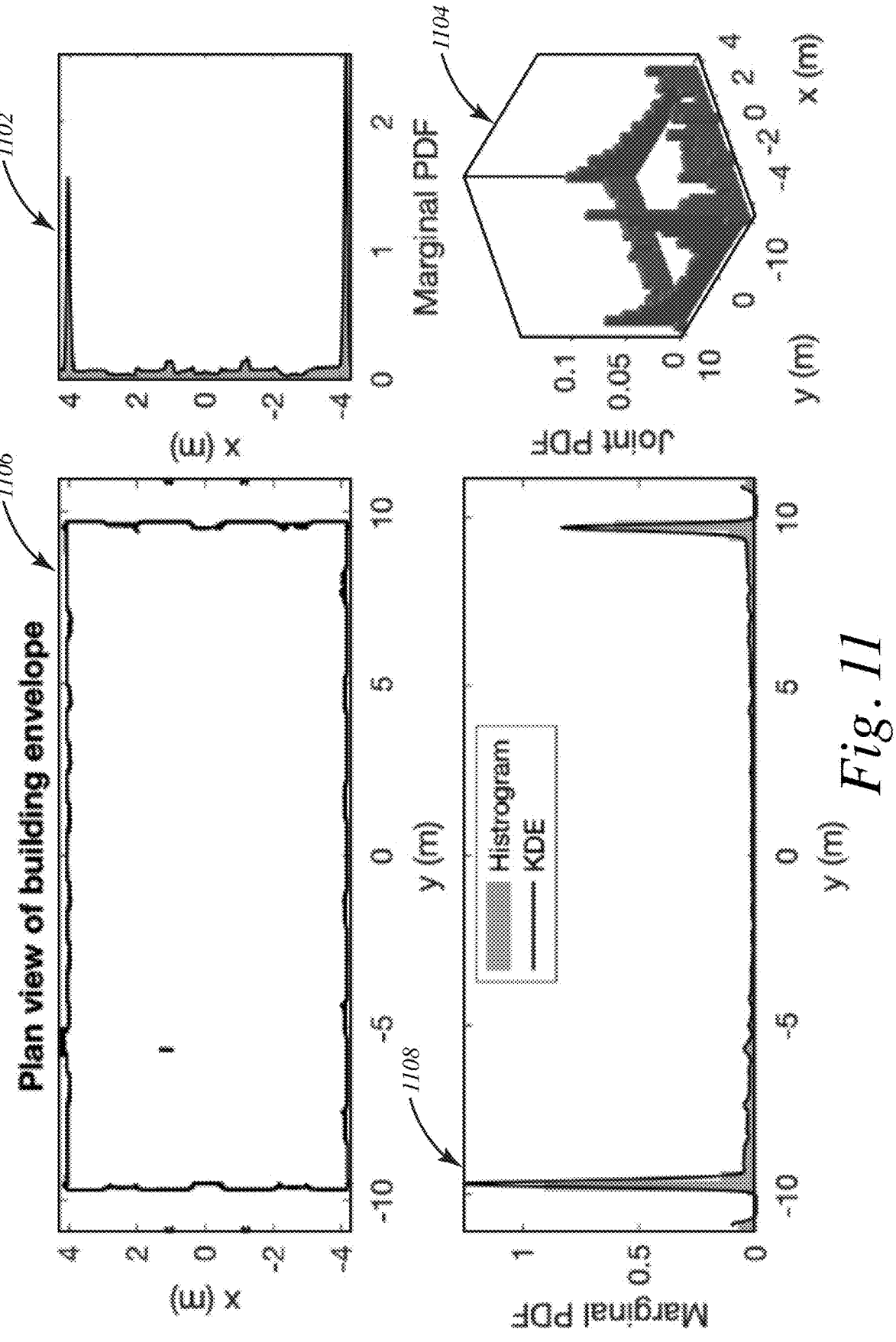
FIG. 11 illustrates a plan view of building envelope with joint and marginal probability density functions (PDFs) of the x and y components.

The plot 1106 of FIG. 11 shows the resulting plan view of the building envelope. By aligning the envelope E with the x- and y-axis, the individual facades can be identified by looking at the distribution of points over each axis. The histograms 1104, 1108, 1102 in FIG. 11 correspond to the joint and marginal distributions of $[x \ y] \subset E$. The marginal probability density functions (PDFs) pdf(x), and pdf(y) can be approximated using kernel density estimators (KDEs). The Gaussian kernel can be used in the KDE and the bandwidth can be selected following Silverman's rule of thumb.

The marginal PDFs 1102, 1108 have two main modes, each of which corresponds to one of the four facades of the building envelope. Let $x_{>0}=\arg\max_{x>0} \text{pdf}(x)$ be the largest mode for the positive values in the x-axis. Similarly, define $x_{<0}$ for the negative x-axis, and $y_{>0}$, $y_{<0}$ for the y-axis. Although each mode defines the average location of facade, the facade thickness can be obtained by selecting the interval between the inflection points around each mode. Let $$x_{>0}^{L} = \arg\max \ x_{>0} \frac{d}{dx} pdf(x)$$

and $$x_{>0}^{R} = \arg\min \ x_{>0} \frac{d}{dx} pdf(x)$$

be the inflection points around $x_{>0}$. Note that the inflections points bound the corresponding mode on the left and right as follows:

$$x_{>0}^{L} < x_{>0} < x_{>0}^{R}.$$

Using similar definitions for the remaining modes, the four facades of the building envelope can be extracted as:

$$F_x^{y<0} = \{p \in P \mid x_{<0}^{R} \le x \le x_{>0}^{L}, \ y_{<0}^{L} \le y_{<0}^{R}\} \quad (3a)$$

$$F_x^{y>0} = \{p \in P \mid x_{<0}^{R} \le x \le x_{>0}^{L}, \ y_{>0}^{L} \le y \le y_{>0}^{R}\} \quad (3b)$$

$$F_y^{x<0} = \{p \in P \mid x_{<0}^{L} \le x \le x_{<0}^{R}, \ y_{<0}^{R} \le y \le y_{>0}^{L}\} \quad (3c)$$

$$F_y^{x>0} = \{p \in P \mid x_{>0}^{L} \le x \le x_{>0}^{R}, \ y_{<0}^{R} \le y \le y_{>0}^{L}\} \quad (3d)$$

The procedure described here is intended for a traditional building envelope with four perpendicular facades. This approach can be modified in connection with more complex geometry.

Figure 12:
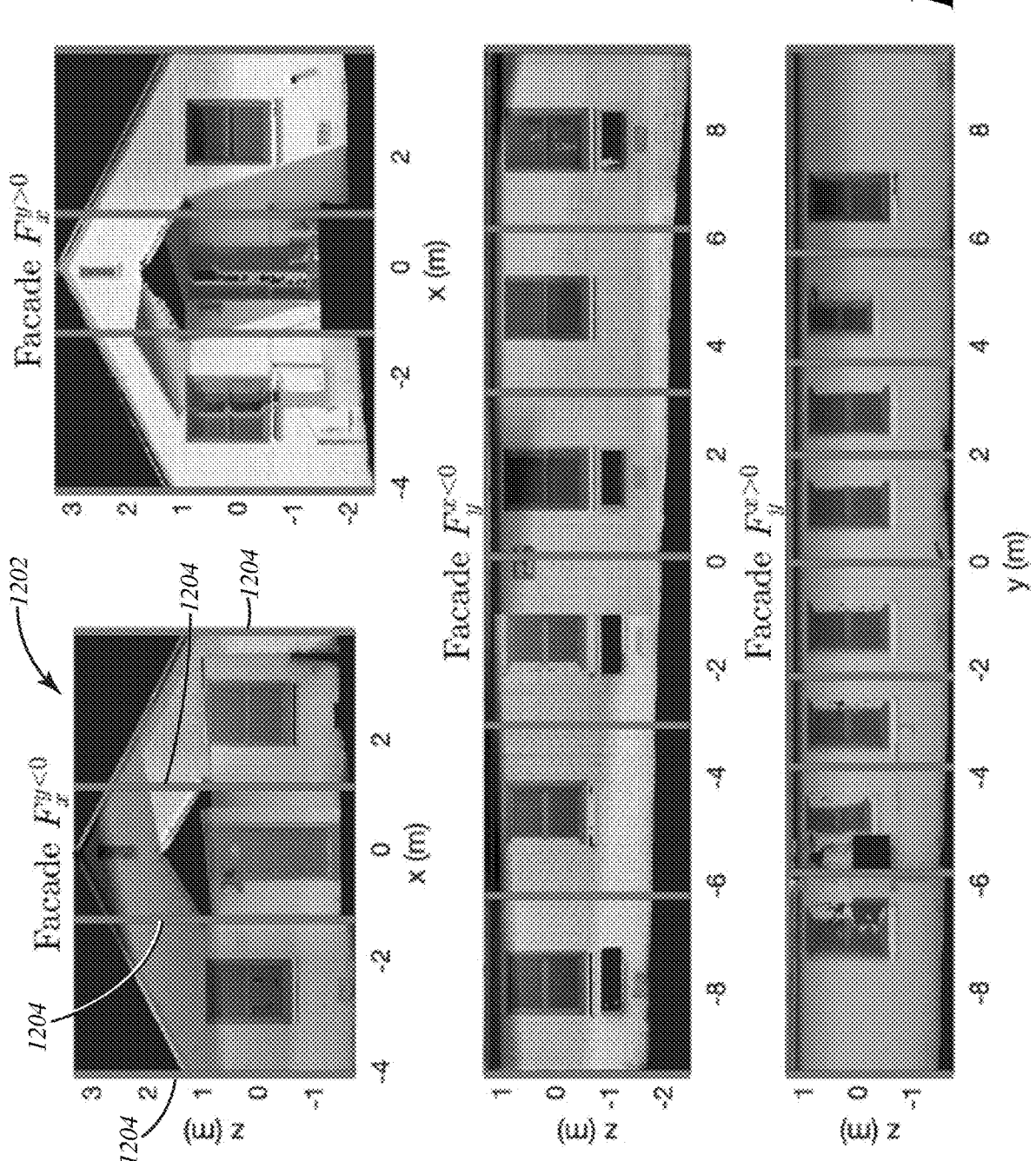
FIG. 12 illustrates four perpendicular facades from the building envelope sectioned according to identified features.

Each facade can be individually analyzed to extract its main opening features (e.g., doors and windows). Based on traditional residential construction practices, it can be assumed that the window and door frames are recessed with respect to the exterior wall surface. Therefore, and thanks to the high resolution of the point cloud data, the facade thickness can be sliced into three main subsets: 1) interior points corresponding to windows and doors, 2) wall points, and 3) exterior points corresponding to features such as roof overhangs and windowsills. In order to slice the facade, the point cloud distribution with respect to the thickness axis can be considered. However, this method assumes that the facade is flat, which is not always the case. To remove flatness assumptions, the facade can be decomposed into different sections depending on the number of features in the facade. An unsupervised k-means clustering algorithm can be used to segment each facade into k sections. The k parameter can be provided given by the user based on their understanding of how many opening features are present in the facade. FIG. 12 shows how each facade can be automatically divided into sections corresponding to the number of features.

The algorithm assumes that each section is locally flat, even though the combined facade is not. Therefore, for each section within a facade, interior, wall, and exterior features can be identified using the point cloud distribution of the thickness axis. As an example, consider dividing the first facade 1202 in FIG. 12 into the sections $$\left\{F_{x,k}^{y<0}\right\}_k \in_{\{1,2,3\}}$$

depicted by vertical lines 1204. Under the locally-flatness assumption, the facade section will be aligned with a plane of the form $y=a_k x+b_k z +c_k$. Moreover, consider the following coordinate transformation to align each section with the xz-plane:

$$y_{<0}^k = y - (a_k x + b_k z + c_k) + \mathbb{E}[y] \qquad (4)$$

Figure 13:
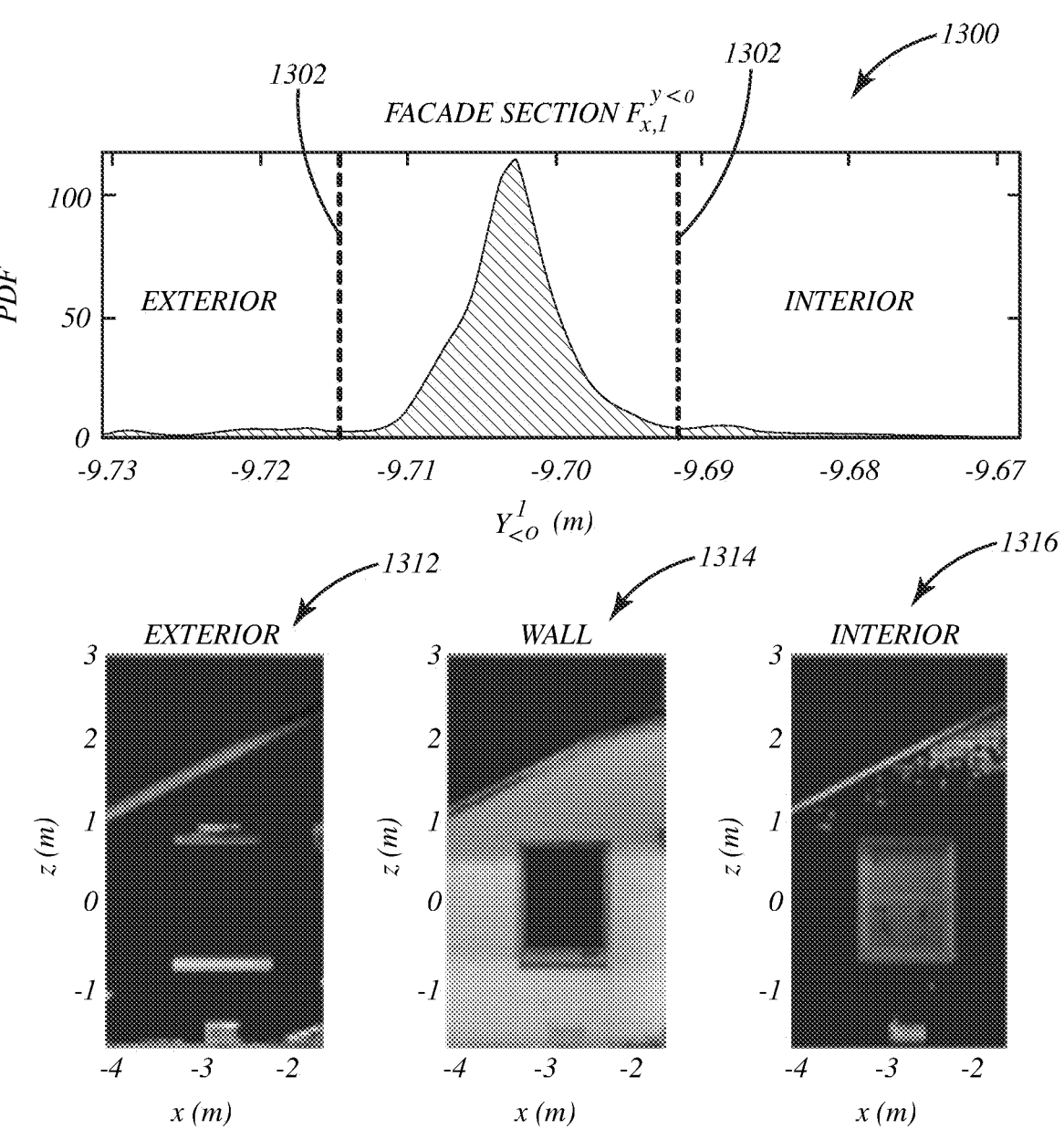
FIG. 13 illustrates segmentation of the facade into exterior, wall, and interior points by analyzing individual sections.

The parameters of the linear function can be found using robust least squares with bisquare weights due to the existence of outliers. FIG. 13 shows the probability density function $$\left(y_{<0}^k\right)$$

for each section in plot 1300. Although the resulting PDF is not unimodal, there is a clear dominant mode where the wall points are located. Let $$\hat{y}_{<0}^k = \arg \max pdf\left(y_{<0}^k\right)$$

be the dominant mode, then the thickness interval corresponding to wall points can be defined as $$y_{<0}^{k,L} \le y_{<0}^k \le \hat{y}_{<0}^{k,R},$$

where:

$$\hat{y}_{<0}^{k,L} = \max\left\{y_{<0}^k < \hat{y}_{<0}^k \,\Big|\, \frac{d}{dy}pdf\left(y_{<0}^k\right) = 0\right\} \qquad (5a)$$

$$\hat{y}_{<0}^{k,R} = \min\left\{y_{<0}^k > \hat{y}_{<0}^k \,\Big|\, \frac{d}{dy}pdf\left(y_{<0}^k\right) = 0\right\}. \qquad (5b)$$

The bounds in Eqns. (5a and 5b) correspond to the points of the PDF to the left and to the right of the dominant mode, respectively. This interval for each section is pictured in FIG. 13 by the dashed lines 1302. Consequently, the exterior points satisfy $$y_{<0}^k < \hat{y}_{<0}^{k,L}$$

while the interior points correspond to $$y_{<0}^k > \hat{y}_{<0}^{k,R}.$$

This is also true for facade $$F_y^{x<0},$$

with the appropriate reformulation of the PDFs over the x-axis. However, keep in mind that the reverse is true for facades $$F_x^{y>0} \text{ and } F_y^{x>0}$$

because of the positive sign of the thickness component. Finally, let $$W_{x,k}^{y<0}, I_{x,k}^{y<0}, \text{ and } T_{x,k}^{y<0}$$

be the point clouds corresponding to wall points, interior points, and exterior points, respectively.

FIG. 13 also shows the resulting point clouds of the exterior, wall, and interior sections 1312, 1314, 1316. In this example, the original assumption of recessed window/door placement holds, and the interior points correspond mostly to the windows and door points. However, one can observe that roof and ground features are also present in the set of interior points. This leads to the inclusion of the outlier removal step, where the roof, ground, and other facade characteristics are purposely removed in order to enhance the ability to extract the dimensions of windows and doors.

A distanced-based outlier removal can be used to clean up the individual point cloud sections in order to extract accurate dimensions and locations of building features. As discussed in connection with the previous embodiment, the Mahalanobis distance can be used to determine outliers. However, in this embodiment a new metric developed for rectangular point clouds can be utilized instead.

Let $p \in \Pi$, where $\Pi$ is a point cloud corresponding to wall or interior points. Consider the normalization:

$$\tilde{p} = \frac{p - \mathbb{E}[p]}{\mathbb{M}[|p - \mathbb{M}[p]|]} \in \tilde{\Pi} \qquad (6)$$

Here, $\mathbb{M}[\cdot]$ is the median function. The zero-mean and unit median absolute deviation transformation is a robust normalization approach to deal with outliers in each point cloud. Note that Eqn. (6) transforms the Cartesian coordinates of rectangular prisms, such as windows, doors, and rectangular walls, into cubes centered at the origin. In order to draw a boundary around the cube and remove outliers, the Chebyshev metric can be applied to the rectangular coordinates of the normalized point cloud:

$$D_C(\tilde{p}) = \max\{|\tilde{x}|, |\tilde{y}|, |\tilde{z}| \,|\, [\tilde{x} \; \tilde{y} \; \tilde{z}] \subset \tilde{p}\} \qquad (7)$$

Outliers are generally miss-classified points that are not only physically distant from the cluster centroid but also correspond to a different material. For example, note that point clouds of interior points $$I_{x,k}^{y<0}$$

in FIG. 13 have outliers corresponding to brick cladding and roof tiles. Such outliers are made of materials different from those of window frames. Therefore, the normalized light intensity $\bar{L}$ can also be used to identify outliers since it correlates well with the reflectivity of the material. Consider the following metric for identifying outlier points:

$$\mathbb{D}: \mathbb{R}^7 \to \mathbb{R}^+, \mathbb{D}(\tilde{p}) = D_C(\tilde{p}) + \alpha|\tilde{L}| \qquad (8)$$

Here, $\alpha>0$ is a calibration parameter that captures the relative importance of the light intensity component with respect to the rectangular coordinates within the point cloud.

The outlier removal task includes discarding the elements of a point cloud with a distance $\mathbb{D}\,(\cdot)$ larger than a preset threshold $D_{thres}$. In other words, the reduced point cloud after the outlier removal task was defined as:

$$\prod_{\mathbb{D}} \{p \in \prod | \mathbb{D}(\tilde{p}) < D_{thres}, \tilde{p} \in \tilde{\Pi}\} \qquad (9)$$

The calibration parameter $\alpha=1$ works well for the exemplary facades of this embodiment. However, the threshold $D_{thres}$ may not be uniform along all sections. As described by the flowchart in FIG. 27, the outlier removal task of the Auto-CuBES may be iterated by the user. For example, after a visual inspection of the resulting point cloud, the user can decide to pick a larger or smaller threshold $$D_{thres}^{i+1}$$

at iteration i. In an exemplary application of this embodiment, a value of $$D_{thres}^0 = 4$$

may provide a good starting point for the iteration.

Following the same example as before, consider the wall points $$W_{x,k}^{y<0}.$$

After outliers are removed from each section, the wall points of the entire facade correspond to the union of all different sections, i.e., $$W_{x,D}^{y<0} = \bigcup_k W_{x,k,D}^{y<0}.$$

Figure 14:
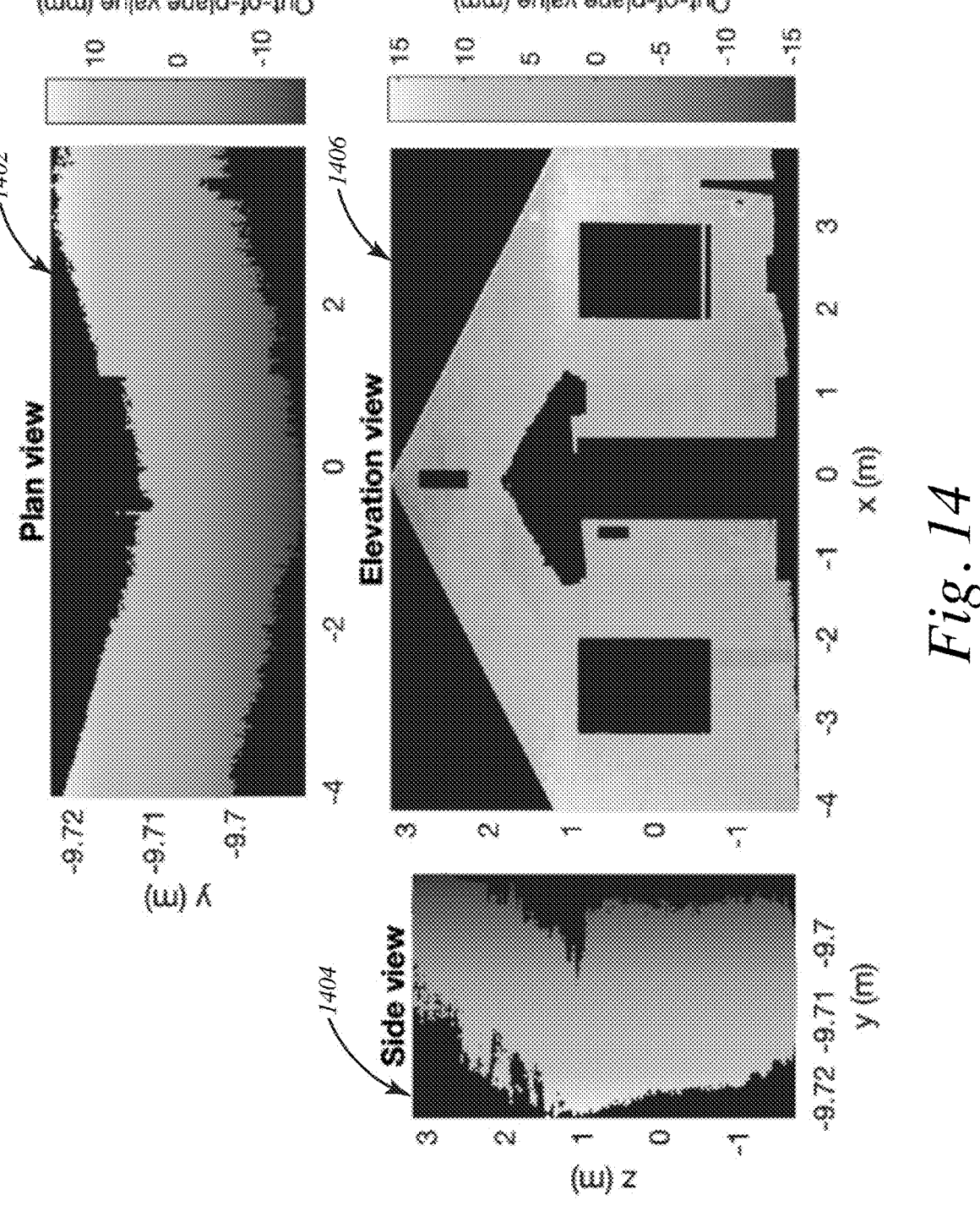
FIG. 14 illustrates plan, side, and elevation views of wall points with a heat map describing the flatness of the outside surface.

FIG. 14 shows the plan 1402, side 1404, and elevation 1406 views of the remaining elements after outlier removal. From the plan view heat map note that the cladding is not flat, but it rather bows inward. The side view indicates that the wall is slightly leaning forward and is not perfectly plumb. The bowing, leaning, or bulging of external walls can be summarized in the elevation view by the grayscale heatmap of the points according to the out-of-plane value, defined as the position of each point with respect to the facade's average plane. The average plane can be calculated with respect to the axis at the thickness of the wall, similar to Eqn. (4) but keeping a zero mean. The grayscale not only helps to determine sections where wall stability may be a problem, but it also assists in the design of optimized connections for overclad panel retrofits.

Figure 23:
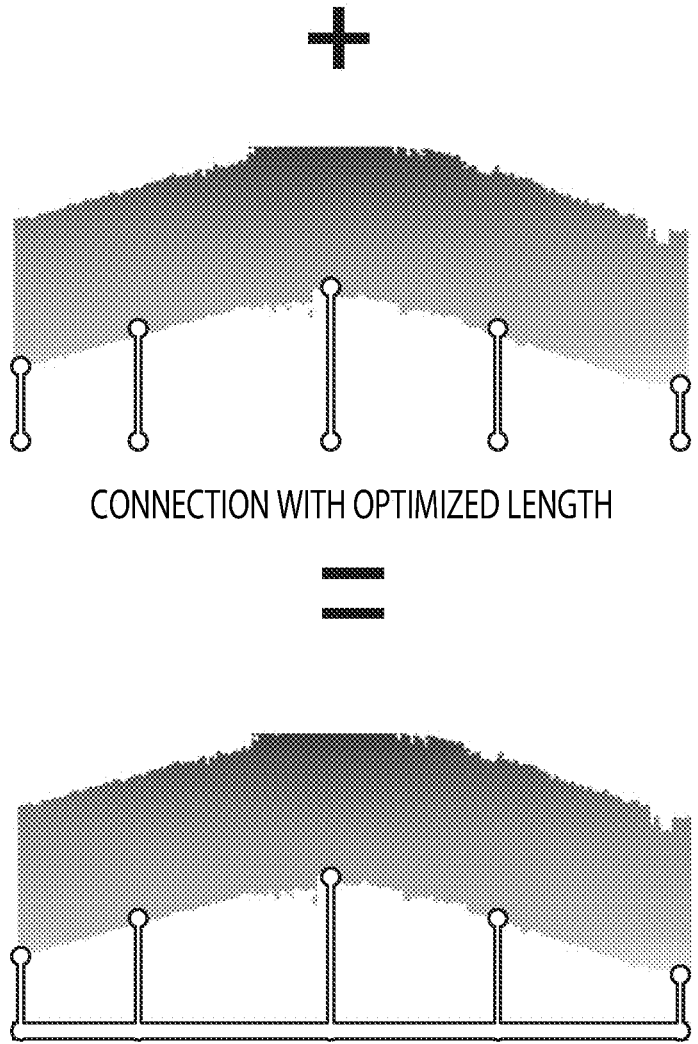
FIG. 23 illustrates a retrofit panel with connections having optimized length.
Figure 24:
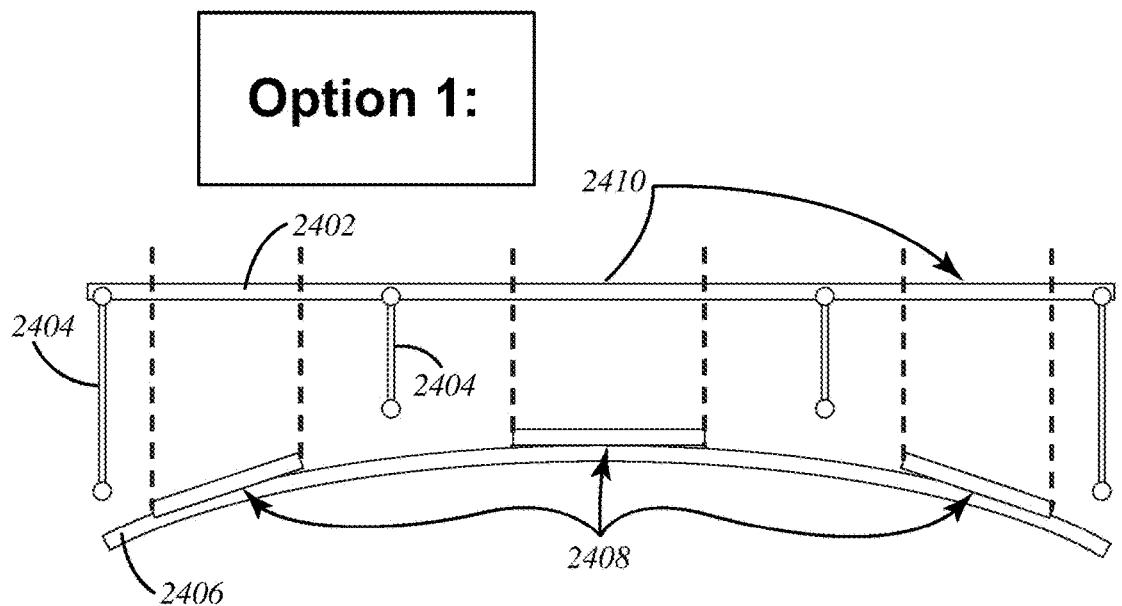
FIG. 24 illustrates one option for handling non-planar walls.
Figure 25:
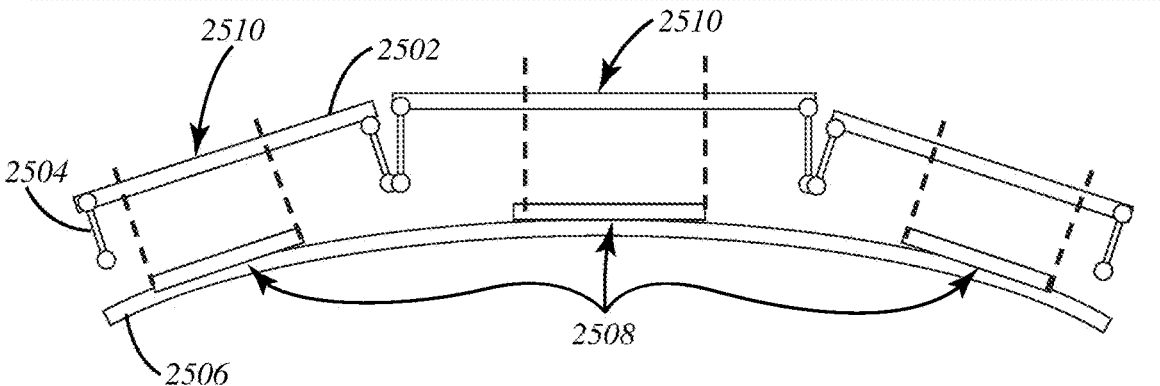
FIG. 25 illustrates another option for handling non-planar walls.
Figures 28, 29:
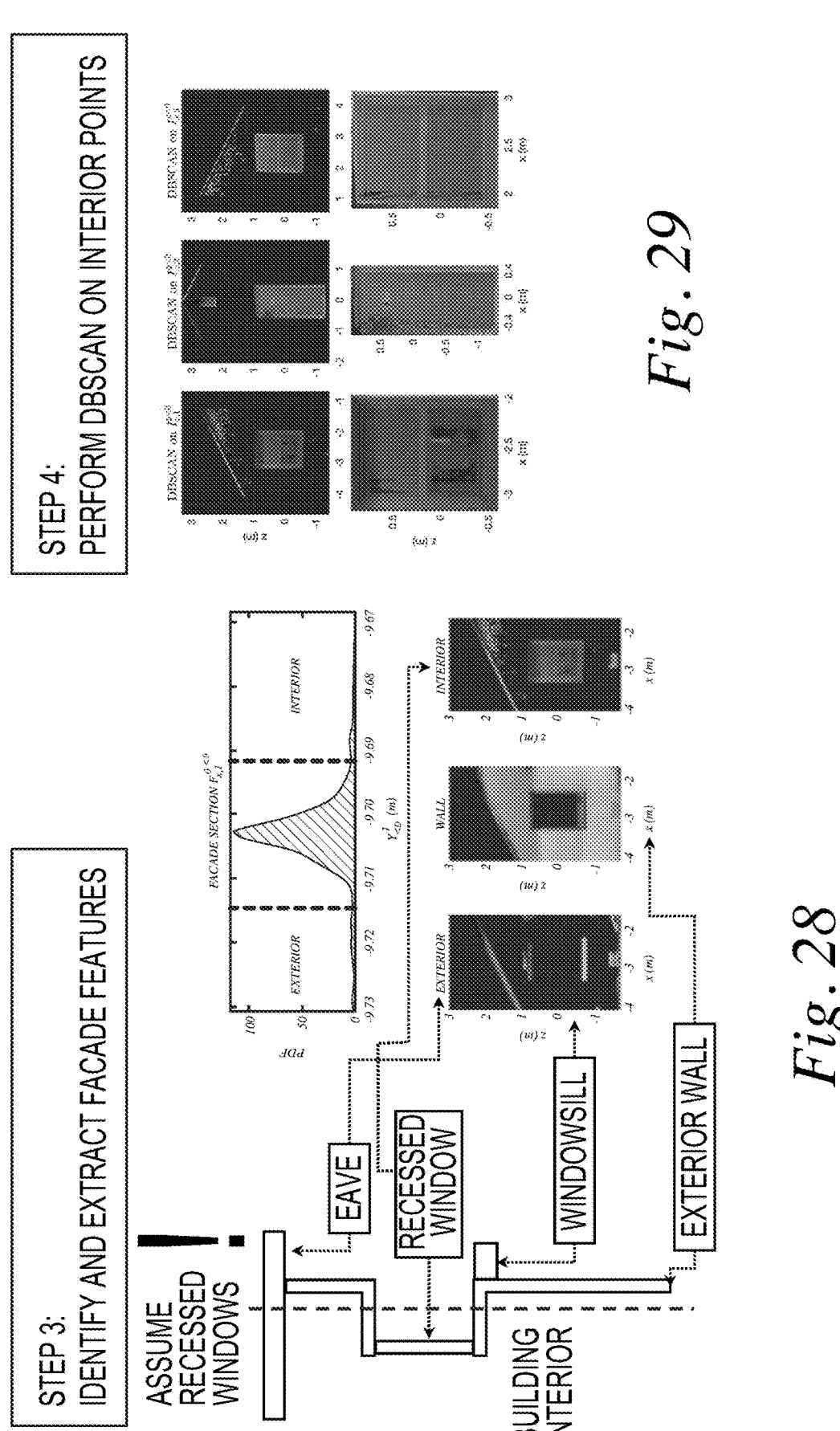

FIG. 23 illustrates how connections with optimized lengths can be identified for connecting retrofit panels to provide a flat retrofit wall. FIGS. 24 and 25 illustrate how non-planar walls can be handled in retrofit solutions. FIG. 24 illustrates one option in which single panel is provided with non-perpendicular optimized connections. The retrofit panel 2402 can have a plurality of connections 2404 with differing lengths that connect to the wall 2406. The retrofit panel has openings 2410 in the building information model projected from the windows 2408 on the wall 2406 surface to provide a flat retrofit wall with aligned openings to the windows. FIG. 25 illustrates another option in which multiple panels with perpendicular fixed connections are provided. Each retrofit panel 2502 has a perpendicular fixed length connection to the wall 2506 that aligns with the window 2508. The openings 2510 in the building information model can match the real dimensions of the windows.

Figure 15:
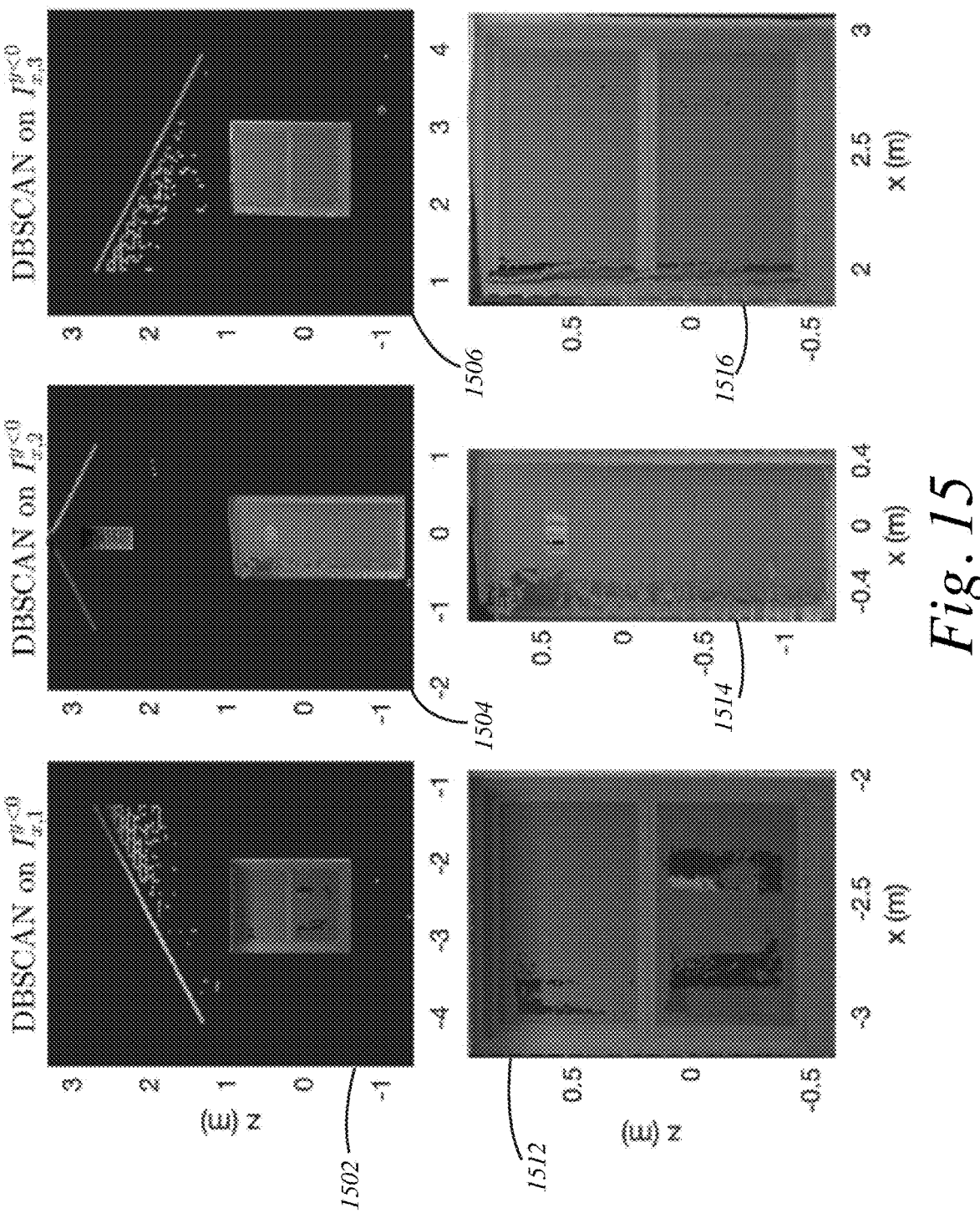
FIG. 15 illustrates outlier removal using DBSCAN.

The plots 1502, 1504, 1506 of FIG. 15 show the interior points $$I_{x,k}^{y<0}$$

for all three sections of the facade. Note that, in contrast to the wall points $$W_{x,k}^{y<0},$$

distinct clusters can be identified corresponding to window/ door points, roof points, and other clusters such as vents. Hence, unsupervised clustering was performed. The algorithm chosen for this task was DBSCAN, which is a density-based clustering algorithm well suited to identify the cluster of each section corresponding to windows and doors. In the current configuration with user-selected parameters, the DBSCAN algorithm determines if a point p belongs or not to a dense cluster by considering a neighborhood of radius $\varepsilon=12$ cm around p, if there are less than m=100 points in the neighborhood, then the point is an outlier. Finally, the dense cluster corresponding to a window/door was decided based on its proximity to the centroid of $$I_{x,k}^{y<0}.$$

The plots 1512, 1514, 1516 of FIG. 15 show the resulting clusters after the DBSCAN algorithm was performed. The subsequent use of the outlier removal method in Eqn. (9) may be used to increase accuracy of dimensions.

Figure 16:
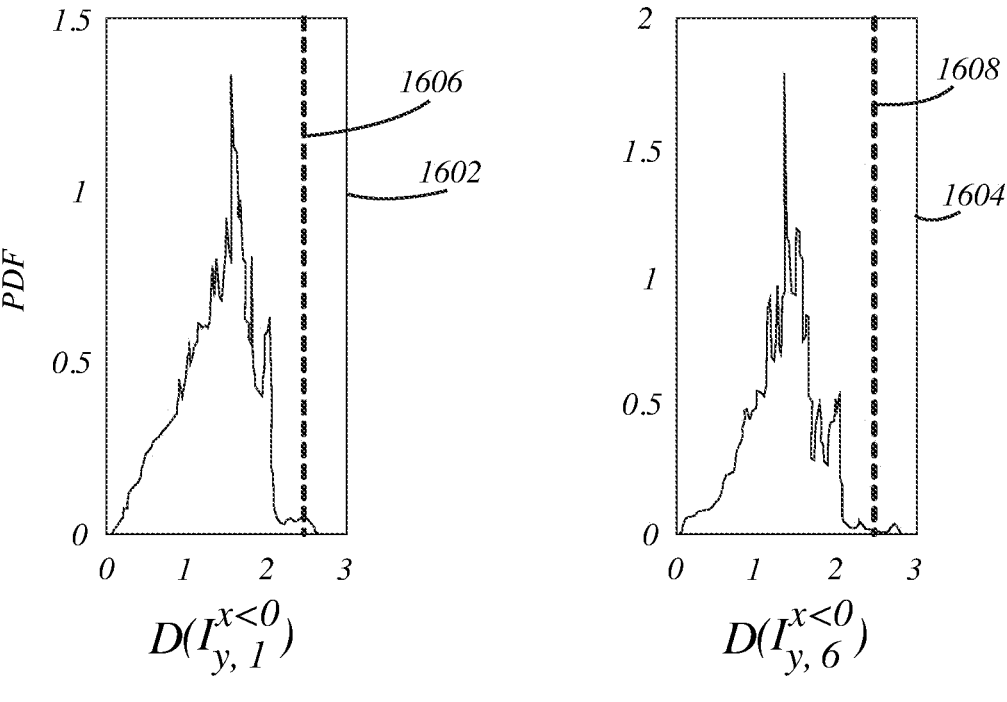
FIG. 16 illustrates exemplary global outlier removal for windows.
Figure 16:
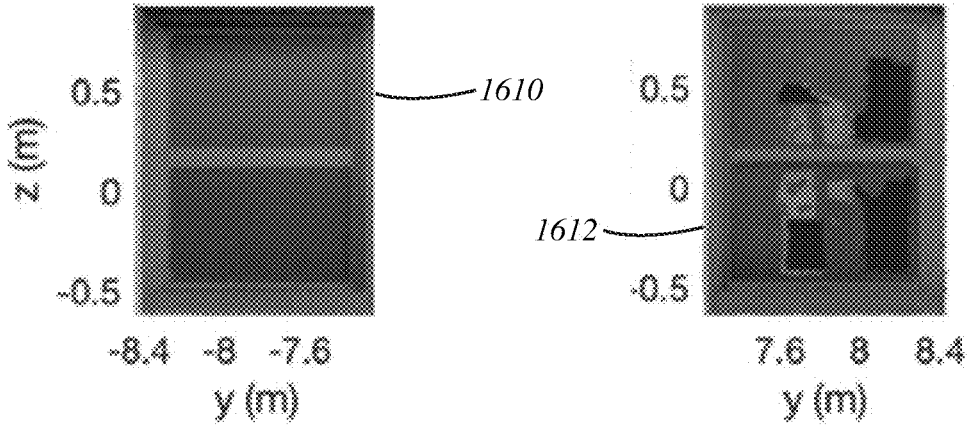

FIG. 16 shows an example of the resulting window extracted from facade $$F_y^{x<0}$$

after the sequential application of DBSCAN and the outlier removal metric $\mathbb{D}\,(\cdot)$. The histograms 1602, 1604 shows the histograms of the distance $$\mathbb{D}\!\left(I_{y,k}^{x<0}\right)$$

calculated for window 1 and 6 after running the DBSCAN algorithm. For all the interior points, a value of $\alpha=0.1$ was used to remove outliers mainly based on the cuboid shape of windows and doors. Even though the windows are physically similar, the histograms show some variability. This is due to the sensitivity of the point cloud scan with respect to scanner position, laser's angle of incidence, and window recessed distance from the wall. Nonetheless, a general triangular distribution with a sharp drop after the main mode is discernable. Similar to the wall points, to the extent that the distance threshold for removing outliers was not uniform for all windows and doors, iteration may be helpful. Empirically, a value of $$D_{thres}^0 = 2.5$$

provides a good starting point. The individual values $D_{thres,k}$ for each window are pictured by the dashed lines 1606, 1608 over the histograms. The resulting point clouds 1610, 1612 can be used for extracting the dimensions and relative positions of each window.

Figure 17:
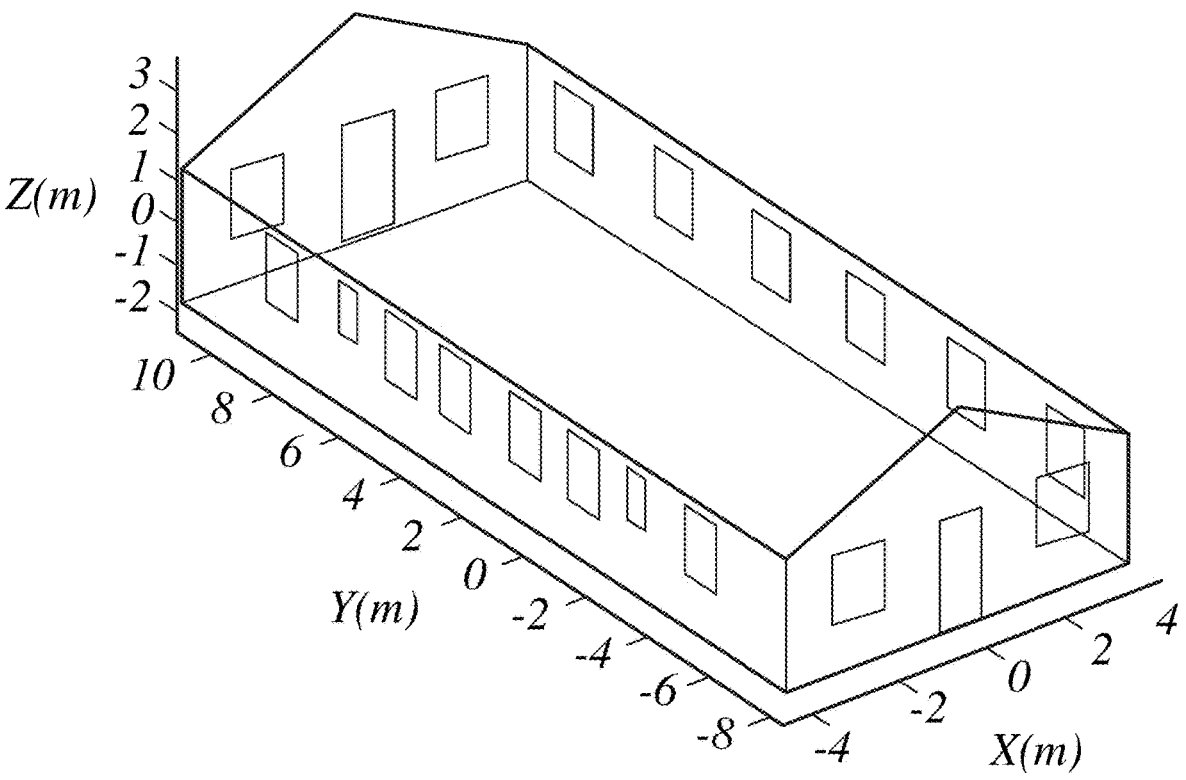
FIG. 17 illustrates an exemplary wireframe model of a building envelope generated using Auto-CuBES.

Once the original point cloud P has been segmented into wall points $$\left(W_{x,D}^{y<0},\, W_{x,D}^{y>0},\, W_{y,D}^{x<0},\, W_{y,D}^{x>0}\right)$$

and interior window/door points $$\left(I_{x,k,D}^{y<0},\, I_{x,k,D}^{y>0},\, I_{y,k,D}^{x<0},\, I_{y,k,D}^{x>0}\right),$$

the position and dimensions of the building envelope and its features can be extracted to create a simple wire-frame model as shown in FIG. 17. First, the exact dimension of each feature can be obtained by solving the minimum-volume oriented bounding box problem. This approach considers the possibility that windows and doors might not be aligned with the building facade. Moreover, as seen in FIG. 14, the facades are not perfectly flat, hence it should not be assumed that the windows are aligned. Thus, the bounding box not only provides the dimensions of each feature but also generates the rectangular prism needed for the wire-frame model. Given that the wall points do not have a rectangular shape, the facade dimensions and wireframe model can be generated using the convex hull. Note that, in either case, a wireframe model generated is limited to convex point clouds. Non-convex facades, such as those with towers, will need a different approach to generate a wire-frame model.

FIG. 17 shows the resulting wire-frame model when combining the convex hulls of wall points and the bounding boxes of windows and doors. Ultimately, the Auto-CuBES algorithm can reduce the highly detailed point cloud of the building envelope (e.g., 32.2 million points) to a simplified wire-frame model (e.g., 309 points) that summarizes the essential information needed for retrofit panel design. Moreover, the wireframe model combined with the out-of-plane coefficient in FIG. 14 can be a powerful tool to obtain necessary as-built dimensions for accurate overclad panel retrofits and for optimizing the position and dimensions of connections on existing facades previous to the retrofit process.

Even though the Auto-CuBES algorithm has few calibration parameters for a single point cloud, the total number of parameters scales linearly with the number of facades and the number of features per facade in the building envelope. Ignoring the time needed to iterate over $$D_{thres}^i$$

for windows and doors in each facade, the Auto-CuBES algorithm can take about 12 minutes to run when implemented in MATLAB on a computer running on a quad-core Intel Core i7.

The various implementations of the Auto-CuBES algorithm can be adapted for different data processing hardware and software platforms. For example, in some embodiments, an Auto-CuBES system can be provided that includes a LiDAR scanning system and a data processing apparatus including a processor, memory, and a display screen. The data processing apparatus may also include specialized hardware such as an application-specific integrated circuit (ASIC) or a field-programmable gate array (FPGA) to accelerate the processing of point cloud data.

Figure 32:
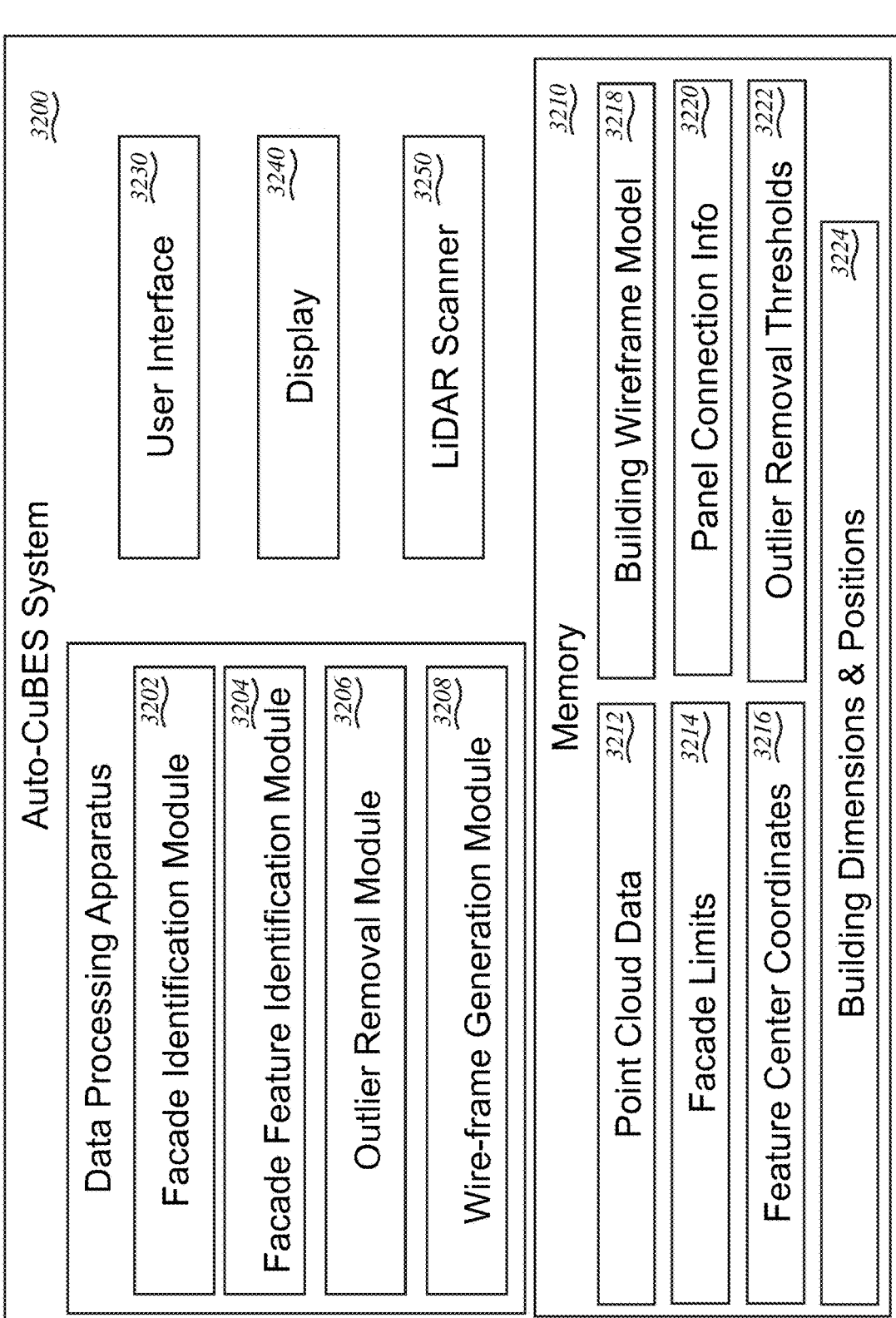
FIG. 32 illustrates an exemplary Auto-CuBES System including a data processing apparatus, user interface, display, and LiDAR Scanning System.

FIG. 32 illustrates a system diagram of an exemplary Auto-CuBES system 3200 designed to perform the automatic segmentation of point cloud data for building envelope retrofit applications. The system includes a data processing apparatus 3230, memory 3210, a LiDAR scanner 3250, and a user interface 3230 with a display 3240.

The data processing apparatus is responsible for executing the Auto-CuBES algorithm. This exemplary data processing apparatus includes multiple specialized modules, including a Façade Identification Module 3202, a Façade Feature Identification Module 3204, an Outlier Removal Module 3206, and a Wire-frame Generation Module 3208. The Façade Identification Module processes the raw point cloud data to identify and extract individual façades of the building envelope. The Façade Feature Identification Module further analyzes the data to identify features such as windows, doors, and other architectural elements. The Outlier Removal Module cleans the data by removing outliers, which are points that do not accurately represent the building envelope or its features. The Wire-frame Generation Module generates a wireframe model of the building envelope based on the processed point cloud data.

The memory component 3210 stores various types of data for use during operation of the system, including point cloud data 3212, façade limits 3214, feature center coordinates 3216, outlier removal thresholds 3222, building dimensions and positions 3224, the building wireframe model 3218, and panel connection information 3220. The point cloud data can include 3D coordinates of the building envelope obtained from the LiDAR scanner or subsets thereof, such as subsets of point cloud data that represent individual facades of the building or point cloud data that has been filtered (e.g., with outlier removal). Façade limits define the boundaries of each identified façade, while feature center coordinates provide the central points of identified features such as windows and doors, which are useful for the façade feature identification module. Outlier removal thresholds are calibration parameters used by the Outlier Removal Module to determine which points are considered outliers, these may have default values but can also be adjusted via the user interface 3230. Building dimensions and positions are the extracted dimensions and relative positions of the building envelope, which can be utilized to generate a building wireframe. The building wireframe model is the final wireframe generated by the system, which can be exported for further use in retrofit panel design. Panel connection information relates to the optimized connections for installing overclad panels on the building envelope.

The user interface 3230 allows a user to interact with the system, adjust calibration parameters, and view the results of the Auto-CuBES process. The display 3240 provides visual feedback, such as the identified façades, features, and the final wireframe model. The LiDAR scanner 3250 is responsible for capturing the point cloud data by scanning the building envelope. This data serves as the input for the Auto-CuBES algorithm, which processes it to generate the wireframe model.

The user interface facilitates user interaction with the Auto-CuBES systems and methods. It can provide visualizations of the point cloud data, allow users to set calibration parameters, and display the resulting wireframe models. The software component of the Auto-CuBES algorithm can be optimized and deployed on various operating systems, leveraging multi-threading and parallel processing capabilities to enhance performance. The integration of these hardware and software elements ensures that the Auto-CuBES system can efficiently process large point cloud datasets, generate accurate wireframe models, and facilitate the design and installation of retrofit panels. The user interface thus not only improves the usability of the system but also ensures that users can easily interact with and adjust the system parameters to achieve the desired results.

The accuracy of the Auto-CuBES can be quantified by comparing the resulting dimensions for windows and doors versus manual laser measurements. Before discussing the results, it is important to mention two main caveats: 1) Manual measurements contain human errors: The person measuring needs to aim the laser at the exact interface between the window frame and the brick; and 2) in general, only corner points are used to generate manual measurements; assuming that the rough openings of windows and doors are square and straight.

Figure 18:
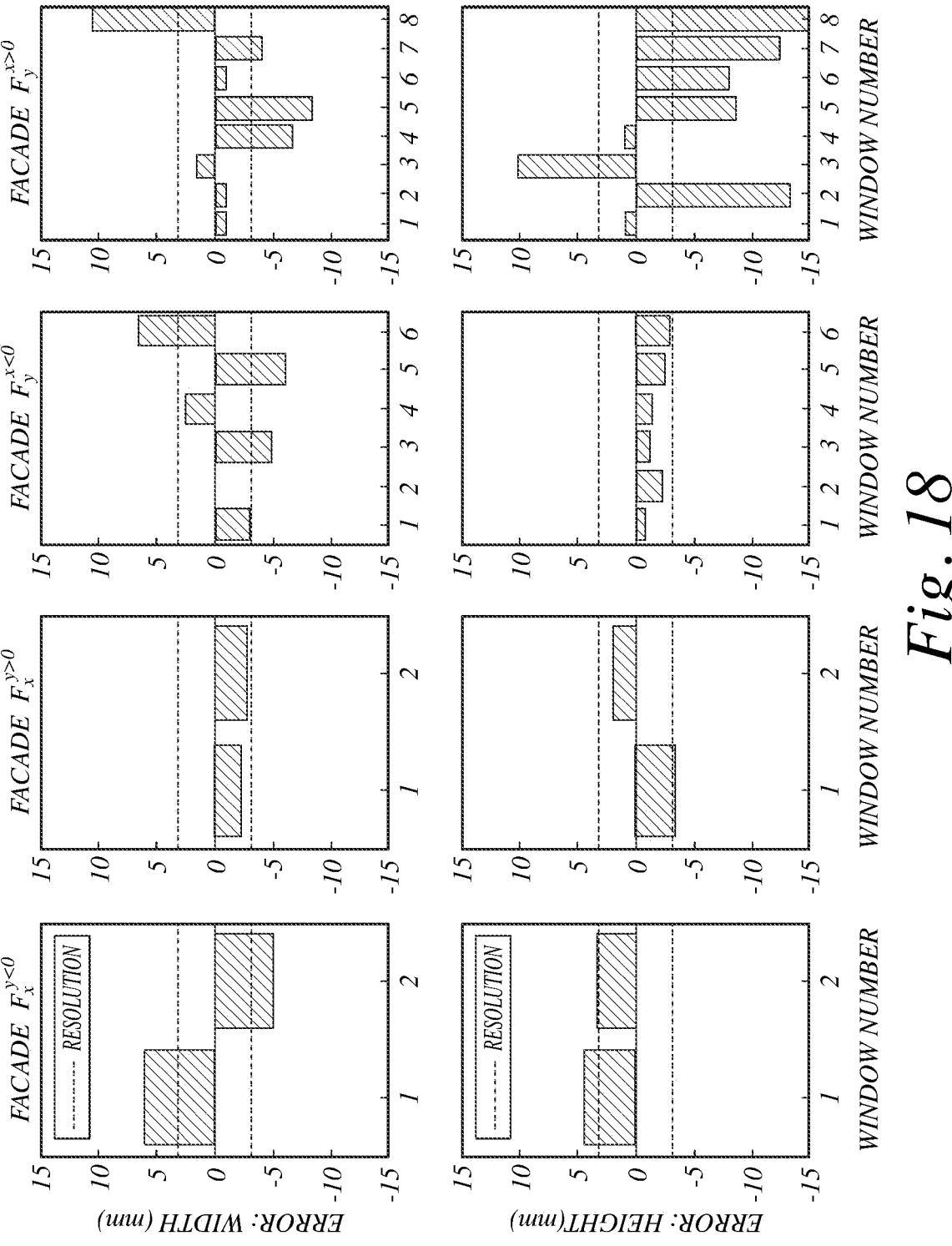
FIG. 18 illustrates error between bounding box dimensions and manual laser measurements for exemplary windows.

FIG. 18 shows exemplary differences between window dimensions obtained using the Auto-CuBES and manual measurements of the same facades. The calculated error is shown as a bar plot for each window's width (top row) and height (bottom row), and the scanner resolution (3 mm) is depicted with the dashed lines in each plot. Facades $$F_x^{y<0} \text{ and } F_x^{y>0}$$

show errors comparable to the scanner resolution. They also correspond to the narrow section of the envelope, in which the scanner could maintain a high resolution throughout. Facade $$F_y^{x<0}$$

shows a low error on window height, but some larger errors on window width. This is probably due to variable resolution across the facade. Although, on average, the scan has a 3 mm resolution, the actual controllable variable in the scanner is the angle increments for the robotic laser head. This means that surfaces that are scanned at an angle (e.g., edge of a wide facade) can have lower resolution than points directly in front of the scanner head. Finally, facade $$F_y^{x>0}$$

shows the largest errors among all. This was probably due to the scanner location with respect to the facade. In contrast to the other scans, the scanner position was not perpendicular to the facade due to the topographical constraints of the terrain around the building. Thus, the scan was taken at an angle and at a different altitude compared with the rest of the scans. This caused resolution and line-of-sight issues for the scanner.

To summarize the results, the mean absolute error (MAE) was calculated for all features in the building envelope. The width MAE was 4 mm while the height MAE was 4.4 mm when the four facades were included. This resulted in an overall MAE of 4.2 mm with an average scan resolution of 3 mm. If, however, facade $$F_x^{y>0}$$

is excluded due to the nonideal scanning conditions, the overall MAE is closer to 3.2 mm. This indicates that, during ideal scanning conditions, the point cloud resolution is maintained, and the error is minimized when the dimensions were automatically extracted from the point cloud.

The Auto-CuBES algorithm provided by this disclosure enables extracting as-built dimensions of facades, windows, and doors from a 3D point could of a building envelope. The algorithm is intended for simple one-floor structures comprising four main perpendicular convex facades, and rectangular windows and doors. The Auto-CuBES can process 32.2 million elements of a 3D point cloud and extract the minimum required points (309 in this study) to generate a wire-frame model of the building envelope. Additionally, the flatness of the external cladding can be evaluated to optimize the design of connections for overclad panel retrofits. The individual tasks of the Auto-CuBES algorithm are based on unsupervised machine learning methods which do not require a training set with labeled data. The Auto-CuBES system and method can expedite and reduce the cost of accurate overclad retrofits to bring old buildings up to energy codes.

Directional terms, such as "vertical," "horizontal," "top," "bottom," "upper," "lower," "inner," "inwardly," "outer" and "outwardly," are used to assist in describing the invention based on the orientation of the embodiments shown in the illustrations. The use of directional terms should not be interpreted to limit the invention to any specific orientation(s).

The above description is that of current embodiments of the invention. Various alterations and changes can be made without departing from the spirit and broader aspects of the invention as defined in the appended claims, which are to be interpreted in accordance with the principles of patent law including the doctrine of equivalents. This disclosure is presented for illustrative purposes and should not be interpreted as an exhaustive description of all embodiments of the invention or to limit the scope of the claims to the specific elements illustrated or described in connection with these embodiments. For example, and without limitation, any individual element(s) of the described invention may be replaced by alternative elements that provide substantially similar functionality or otherwise provide adequate operation. This includes, for example, presently known alternative elements, such as those that might be currently known to one skilled in the art, and alternative elements that may be developed in the future, such as those that one skilled in the art might, upon development, recognize as an alternative. Further, the disclosed embodiments include a plurality of features that are described in concert and that might cooperatively provide a collection of benefits. The present invention is not limited to only those embodiments that include all of these features or that provide all of the stated benefits, except to the extent otherwise expressly set forth in the issued claims. Any reference to claim elements in the singular, for example, using the articles "a," "an," "the" or "said," is not to be construed as limiting the element to the singular.

The embodiments of the invention in which an exclusive property or privilege is claimed are defined as follows:

1. A system for producing a wireframe model of a building envelope from a point cloud representing the building envelope, the point cloud being a result of scanning the building envelope with a light detection and ranging (LiDAR) system, the system comprising:

a data processing apparatus configured to:

obtain a point cloud representation of a building envelope, the point cloud including a plurality of points wherein each of the plurality of points collectively represents coordinates, light intensity, and pixel color;

extract a subset of the plurality of points representing each of the individual facades of the building envelope;

receive a k-means clustering parameter from a user interface;

for each façade, using a k-means clustering algorithm, segment the façade into a number of facade sections based on the coordinates and the light intensity of the subset of the plurality of points representing the façade of the building envelope as well as the k-means clustering parameter;

divide each facade section into three sets of features representing interior, wall, and exterior features, wherein the interior, wall, and exterior features each being associated with certain points of the facade section;

remove outliers from each facade section;

produce a building envelope wire frame model from the segmented facade sections having outliers removed, wherein the wire frame model accurately represents dimensions of the building envelope; and

a user interface communicatively coupled with the data processing apparatus and configured to present wire frame model produced by the data processing apparatus.

2. The system of claim 1 wherein the data processing apparatus is configured to extract a subset of the plurality of points representing each of the individual facades of the building envelope by solving a minimum-volume oriented bounding box problem using an expected value function and a calibration parameter.

3. The system of claim 2 wherein the data processing apparatus is configured to approximate marginal probability density functions using kernel density estimators.

4. The system of claim 1 wherein the data processing apparatus is configured to remove outliers from each facade section using a combination of global outlier removal using an $X^2$ hypothesis test based on Mahalanobis distance and local outlier removal using local distance-based outlier detection factor (LDOF).

5. The system of claim 1 wherein the data processing apparatus is configured to remove outliers from each facade section using a combination of outlier removal for wall points and outlier removal for interior points.

6. The system of claim 1 wherein the data processing apparatus is configured to remove outlier points from the plurality of points representing each of the façade sections that are over a threshold distance from a center of the facade section.

7. The system of claim 1 wherein the data processing apparatus is configured to remove outlier points from the plurality of points representing each of the facade sections that correspond to a different material based on normalized light intensity.

8. The system of claim 1, wherein the light intensity is based on intensity of light scattered by the building-envelope's constituents in response to a LiDAR system building envelope scan.

9. The system of claim 1, wherein the data processing apparatus is configured to segment the façade into a number of facade sections using k-medoids clustering based on points with low light intensity and user-defined center coordinates for facade features.

10. The system of claim 1, wherein the data processing apparatus is configured to solve a minimum volume bounding box problem to align windows and doors with coordinate axes.

11. The system of claim 1, wherein the data processing apparatus is configured to determine an out-of-plane deviation of the building-envelope's facade, and optimize, based on the determined out-of-plane deviation of the building-envelope's facade, lengths of connections for installing an overclad panel on the test building-envelope's facade.

12. The system of claim 1, wherein the data processing apparatus is configured to produce the building envelope wire frame model using computed convex hulls and bounding boxes.

13. The system of claim 1, including a storage module communicatively coupled with the data processing apparatus and configured to store the building envelope wireframe model produced by the data processing apparatus.

14. The system of claim 1, wherein the data processing apparatus is an application specific integrated circuit (ASIC).

15. The system of claim 1, wherein the building envelope includes one or more facade each including at least a window or a door.

16. The system of claim 1, including a lidar system configured to scan a building envelope and output the point cloud representing the building envelope.

17. A method for producing a wire frame model of a building envelope, the method comprising:

scanning, using a LiDAR system, a building envelope to generate a point cloud of the building envelope, wherein the point cloud includes a plurality of points collectively representing coordinates, light intensity, and color of the building envelope;

automatically, with a data processing apparatus, extracting a sub-point cloud representing each of the individual facades of the building envelope;

automatically, with a data processing apparatus, partitioning each individual facade into different façade sections, wherein each façade section includes at least one opening;

automatically, with a data processing apparatus, extracting wall points of the different facade sections;

automatically, with a data processing apparatus, extracting opening points of the different facade sections;

automatically, with a data processing apparatus, determining an off-of-planeness coefficient for connection design;

removing outliers from the wall points and opening points of the façade sections based on user-defined calibration parameters provided via a user interface; and generating a wireframe model of the building envelope based on a combination of the wall points of the different façade sections, the opening points of the different facade sections, and the off-of-planeness coefficient.

18. The method of claim 17 wherein extracting the sub-point cloud representing each of the individual facades of the building envelope includes solving a minimum-volume oriented bounding box problem using an expected value function and a calibration parameter.

19. The method of claim 17 wherein removing outliers from the wall points and opening points of the façade section includes using a combination of global outlier removal using an $X^2$ hypothesis test based on Mahalanobis distance and local outlier removal using local distance-based outlier detection factor (LDOF).

20. The method of claim 17 wherein removing outliers from the wall points and opening points of the facade section includes removing outliers over a threshold distance from a center of the façade section.

* * * * *